(12) United States Patent
Sakata et al.

(10) Patent No.: US 11,971,661 B2
(45) Date of Patent: Apr. 30, 2024

(54) SUBSTRATE PROCESSING APPARATUS AND SUBSTRATE PROCESSING METHOD

(71) Applicant: Tokyo Electron Limited, Tokyo (JP)

(72) Inventors: Yoji Sakata, Koshi (JP); Masashi Tsuchiyama, Koshi (JP); Tsuyoshi Watanabe, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 17/192,087

(22) Filed: Mar. 4, 2021

(65) Prior Publication Data

US 2021/0278768 A1 Sep. 9, 2021

(30) Foreign Application Priority Data

Mar. 5, 2020 (JP) .................................. 2020-038218

(51) Int. Cl.
*G03F 7/16* (2006.01)
*H01L 21/67* (2006.01)
*H01L 21/677* (2006.01)

(52) U.S. Cl.
CPC ........ *G03F 7/162* (2013.01); *H01L 21/67178* (2013.01); *H01L 21/67184* (2013.01); *H01L 21/67745* (2013.01)

(58) Field of Classification Search
CPC ......... H01L 21/67178; H01L 21/67184; H01L 21/67276; H01L 21/67745
See application file for complete search history.

(56) References Cited

U.S. PATENT DOCUMENTS

| | | | | |
|---|---|---|---|---|
| 5,826,129 A | * | 10/1998 | Hasebe | ............. H01L 21/67178 414/416.03 |
| 2006/0165409 A1 | * | 7/2006 | Akimoto | ............. H01L 21/6719 396/611 |
| 2008/0070164 A1 | * | 3/2008 | Hayashida | ........ H01L 21/67225 430/311 |
| 2018/0052393 A1 | * | 2/2018 | Nishiyama | .............. B05C 13/02 |

FOREIGN PATENT DOCUMENTS

JP 2010-219434 A 9/2010

* cited by examiner

*Primary Examiner* — Dah-Wei D. Yuan
*Assistant Examiner* — Stephen A Kitt
(74) *Attorney, Agent, or Firm* — Pearne & Gordon LLP

(57) ABSTRACT

A substrate processing apparatus includes a first unit block including a first substrate transfer region, a first and a second processing modules provided to face a first and a second sides of the first substrate transfer region in a left-right direction, and a first and a second transfer mechanisms provided at the first and the second sides and configured to deliver a substrate to the first and the second processing modules; a second unit block, stacked on the first unit block, including a second substrate transfer region and a third transfer mechanism; a substrate carry-in/out block provided at a first side of a stack of the unit blocks and configured to deliver the substrate to the first and the third transfer mechanisms; a relay block provided at a second side of the stack and configured to deliver the substrate to the second and the third transfer mechanisms.

20 Claims, 15 Drawing Sheets

FIG. 12

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-038218 filed on Mar. 5, 2020, the entire disclosure of which is incorporated herein by reference.

TECHNICAL FIELD

The exemplary embodiments described herein pertain generally to a substrate processing apparatus and a substrate processing method.

BACKGROUND

To manufacture a semiconductor device, various processings are performed on a semiconductor wafer (hereinafter, referred to as a "wafer") as a substrate. As one of processes for manufacturing a semiconductor device, for example, photolithography is performed. Specifically, in the photolithography, a resist is coated on the wafer to form a resist film and the resist film is exposed and then developed by supplying a developing liquid. For example, Patent Document 1 discloses a substrate processing apparatus that forms and develops a resist film.

Patent Document 1: Japanese Patent Laid-open Publication No. 2010-219434

SUMMARY

In one exemplary embodiment, a substrate processing apparatus includes: a first unit block including a first substrate transfer region extended in a left-right direction; a first processing module and a second processing module provided to respectively face a first side and a second side of the first substrate transfer region in the left-right direction; and a first transfer mechanism and a second transfer mechanism respectively provided at the first side and the second side the first substrate transfer region in the left-right direction of and configured to deliver a substrate to the first processing module and the second processing module, respectively; a second unit block including a second substrate transfer region extended in the left-right direction; and a third transfer mechanism configured to transfer the substrate along the left-right direction in the second substrate transfer region, the second unit block being stacked on the first unit block; a substrate carry-in/out block including first side placing units provided at a first side in the left-right direction of a stack of the unit blocks composed of the first unit block and the second unit block and configured to place therein the substrate to deliver the substrate to each of the first transfer mechanism and the third transfer mechanism, the first side placing units being provided to correspond to heights of the first unit block and the second unit block; and a carrier stage on which a carrier accommodating therein the substrate is placed; a relay block including second side placing units provided at a second side in the left-right direction of the stack of the unit blocks and configured to place therein the substrate to deliver the substrate to each of the second transfer mechanism and the third transfer mechanism, the second side placing units being provided to correspond to the heights of the first unit block and the second unit block; a second side transfer mechanism provided in the relay block to transfer the substrate between the second side placing units; and a first side transfer mechanism provided in the substrate carry-in/out block to transfer the substrate between the carrier and each of the first side placing units, the first side transfer mechanism being configured to transfer the substrate, which is processed by the first processing module and is not processed by the second processing module, from one of the first side placing units corresponding to the height of the first unit block to one of the first side placing units corresponding to the height of the second unit block in order to transfer the substrate from a second side of the first unit block into the second processing module through the second unit block and the relay block in sequence.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

FIG. 12 is a table showing a correspondence between a wafer transfer route and a transfer mechanism used for the wafer transfer in the coating and developing apparatus;

DETAILED DESCRIPTION

Figure 1:
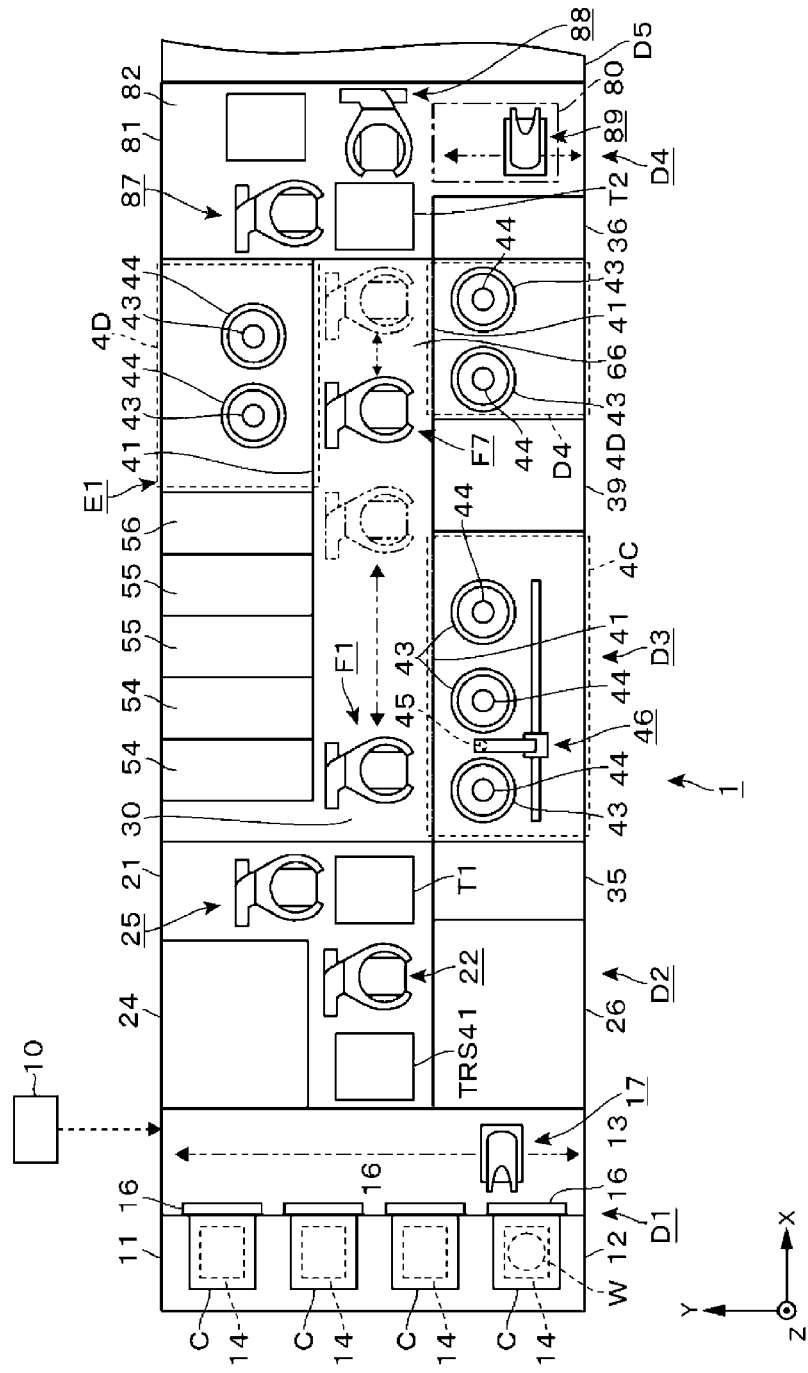
FIG. 1 is a transversal cross-sectional plan view of a coating and developing apparatus according to an exemplary embodiment.

In the following detailed description, reference is made to the accompanying drawings, which form a part of the description. In the drawings, similar symbols typically identify similar components, unless context dictates otherwise.

Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

A coating and developing apparatus 1 as an exemplary embodiment of a substrate processing apparatus according to the present disclosure will be described with reference to a transversal cross-sectional plan view of FIG. 1 and longitudinal cross-sectional front views of FIG. 2 and FIG. 3. The coating and developing apparatus 1 is configured to form various films including a resist film on a wafer W, which is a substrate, and then develops the resist film, which has been exposed by an exposure apparatus D5 connected to the coating and developing apparatus 1, to form a resist pattern. The exposure apparatus D5 is configured to perform exposure in a state where a liquid film formed of, for example, pure water is formed on the surface of the wafer W. That is, the exposure apparatus D5 is configured to perform liquid immersion exposure, and the coating and developing apparatus 1 is equipped with a processing module corresponding the liquid immersion exposure.

The coating and developing apparatus 1 is provided in a clean room of a semiconductor manufacturing factory. As will be described later in detail, the coating and developing apparatus 1 is equipped with a fan filter unit FFU configured to suck air as an atmospheric gas and a filter configured to discharge the sucked air downwards to form a downstream flow (down flow). The filter is placed above a movement area of each transfer mechanism that transfers the wafer W and above a cup in which the wafer W is accommodated and subjected to a liquid processing. Thus, it is possible to suppress scattering of particles from the transfer mechanism or scattering of mist from the cup.

A plurality of wafers W being accommodated in a carrier C, also referred to as a FOUP (Front Opening Unify Pod), is transferred to the coating and developing apparatus 1 by an external transfer mechanism provided outside the coating and developing apparatus 1. The external transfer mechanism that transfers the carrier C, which is a transfer container, is referred to as, for example, an OHT (Over Head Transport) and provided at a ceiling of the clean room.

The coating and developing apparatus 1 includes a carrier block D1, an inspection block D2, a processing block D3 and an interface block D4 linearly arranged in this order in a horizontal direction and connected to each other. The carrier block D1, the inspection block D2, the processing block D3 and the interface block D4 have their bottoms at the same level, and the carrier block D1 has a smaller height than the other blocks D2 to D4. The interface block D4 is connected to the exposure apparatus D5 on the side opposite to the side where the processing block D3 is connected. The carrier block D1 and the inspection block D2 serve as a substrate carry-in/out block, and the interface block D4 serves as a relay block.

In the following descriptions, the arrangement direction of the blocks D1 to D4 will be referred to as a left-right direction, the side with the carrier block D1 will be referred to as a left side and the side with the interface block D4 will be referred to as a right side. Further, when viewed from the carrier block D1 on the left side and the interface block D4 on the right side, a front side of the apparatus will be referred to as a front side and an inner side of the apparatus will be referred to as a back side. In each of the accompanying drawings, an X-axis direction, a Y-axis direction and a Z-axis direction are illustrated as orthogonal to each other. The X-axis direction is the left-right direction, the Y-axis direction is a forward-backward direction and the Z-axis direction is a vertical direction. Further, FIG. 2 and FIG. 3 are longitudinal cross-sectional views of the coating and developing apparatus 1, but illustrate longitudinal cross sections when viewed from different positions on the front and the back of a part of the coating and developing apparatus 1.

Figure 4:
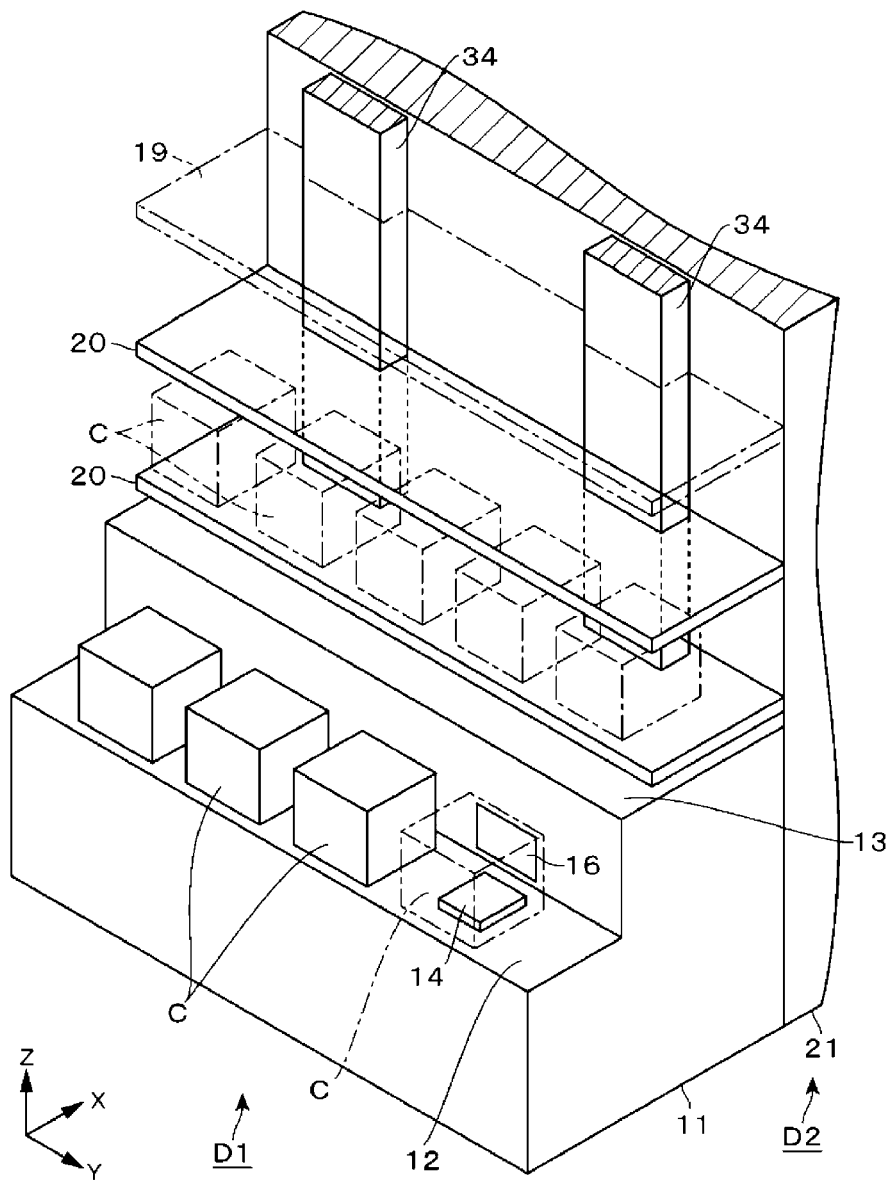
FIG. 4 is a perspective view of a carrier block provided in the coating and developing apparatus.

The carrier block D1 is configured to deliver the wafer W between the coating and developing apparatus 1 and the carrier C which is transferred by a carrier transfer mechanism provided outside the coating and developing apparatus 1. Referring to a perspective view of FIG. 4, the right side of a housing 11 constituting the carrier block D1 protrudes upwards so as to be higher than the left side. Therefore, the housing 11 has a step when viewed from the front. The left side and the right side of the housing 11 configured as such are referred to as a lower body portion 12 and a higher body portion 13, respectively.

On an upper surface of the lower body portion 12, four carrier stages 14 are provided at intervals along the forward-backward direction. A carrier C is placed on each carrier stage 14 to carry in and out a wafer W with respect to the coating and developing apparatus 1. In the housing 11, a left side wall of the higher body portion 13 has a wafer transfer port at a position corresponding to the carrier stage 14, and the wafer transfer port is opened/closed by an opening/closing mechanism 16.

Inside the housing 11, the higher body portion 13 is equipped with a transfer mechanism 17 including a moving body configured to be movable in the forward-backward direction, rotatable around a vertical axis and movable in the vertical direction; and a holding body configured to move the moving body in the forward-backward direction and hold the wafer W. The transfer mechanism 17 serving as a first one-side transfer mechanism delivers the wafer W between the carrier C placed on the carrier stage 14 and the inspection block D2. A filter 18 is provided at a ceiling of the higher body portion 13. The filter 18 is provided to cover a wafer transfer area of the transfer mechanism 17 in the higher body portion 13 and forms a down flow as described above. The filter 18 is also described below when the configuration of the inspection block D2 is explained. For example, a non-illustrated exhaust port is formed at a bottom portion of the housing 11, and the air inside the housing 11 is exhausted through the exhaust port.

The inspection block D2 is configured to inspect the wafer W before and after the processing in the coating and developing apparatus 1. Further, the processing block D3 includes six layers to which the wafers W are respectively transferred and which are stacked one above another. The inspection block D2 also functions to transfer the wafer W in the vertical direction so as to be delivered between the layers of the processing block D3. The inspection block D2 includes a rectangular housing 21, and the housing 21 and the higher body portion 13 of the carrier block D1 form a step when viewed from the front.

At a central portion in the forward-backward direction inside the housing 21, a stack of delivery modules TRS, a transfer mechanism 22 and a tower T1 are arranged in this order from the left side to the right side. Also, a pre-processing inspection module 23 is provided above the stack of delivery modules TRS, and the pre-processing inspection module 23 is configured to optically inspect the wafer W before a processing in each processing module inside the apparatus 1. Further, a post-processing inspection module 24 is provided on the back side of the stack of delivery modules TRS and the transfer mechanism 22. The post-processing inspection module 24 is configured to optically inspect the wafer W after a processing in each processing module inside the apparatus 1, i.e., after the resist pattern is formed thereon. A transfer mechanism 25 is provided on the back side of the tower T1. The transfer mechanisms 22 and 25 serve as second one-side transfer mechanisms provided on the side with the processing block D3 rather than the transfer mechanism 17 that accesses the carrier C is provided on the side with the processing block D3, and form a one-side transfer mechanism together with the transfer mechanism 17.

A module is configured as a place where a wafer W is to be placed. A module configured to perform a processing (including inspection) on a wafer W may be described as a processing module, and a processing module configured to perform a processing using a processing liquid may be described as a liquid processing module. The above-described delivery module TRS includes placing units of the wafer in which the wafers W are arranged in a longitudinal direction. That is, a plurality of wafers W can be arranged in the longitudinal direction in each delivery module TRS. To distinguish the delivery modules TRS provided at the respective positions in the coating and developing apparatus 1, numbers are assigned behind TRS. Delivery modules constituting the stack of delivery modules TRS are referred to as TRS41 and TRS42. TRS41 is a delivery module where a wafer W is placed to be carried into the inspection block D2 from the carrier block D1, and TRS42 is a delivery module where a wafer W is placed to be carried out of the inspection block D2 to the carrier block D1.

The tower T1 includes a plurality of delivery modules TRS and a plurality of temperature control modules SCPL which are stacked one above another, and these modules constitute one side placing units. The processing block D3 includes six layers, and a delivery module TRS and/or a temperature control module SCPL may be provided at positions corresponding in height to the respective layers in order to deliver the wafer W between each layer and the inspection block D2. In FIG. 3, the delivery modules TRS of the tower T1 corresponding to the lowermost layer are denoted by TRS11 and TRS21, and the delivery modules TRS corresponding to the second lowermost layer are denoted by TRS12 and TRS22. The delivery modules TRS of the tower T1 include delivery modules used to deliver the wafer W inside the inspection block D2 and are denoted by TRS17 and TRS18.

Each temperature control module SCPL includes a placing unit where the wafer W is to be placed and a coolant path in the placing unit, and the wafer W placed on the placing unit is controlled to a desired temperature. Also, numbers are assigned behind SCPL, like TRS, to distinguish from each other. In the tower T1, the temperature control modules SCPL are provided at positions corresponding in height to the respective layers of the processing block D3, and denoted by SCPL11 to SCPL16 in this order from below in FIG. 3.

The transfer mechanism 22 includes a moving body configured to be rotatable around the vertical axis and movable in the vertical direction; and a holding body configured to move the moving body in the forward-backward direction and hold the wafer W. Further, the transfer mechanism 22 accesses each of the delivery modules TRS inside the inspection block D2, the pre-processing inspection module 23 and the post-processing inspection module 24 to deliver the wafer W between these modules. The transfer mechanism 25 accesses each of the modules inside the tower T1 to deliver the wafer w between these modules.

Inside the housing 21 of the inspection block D2, the front side of the stack of delivery modules TRS and the transfer mechanism 22 serves as a liquid reservoir area 26 that is provided with a reservoir for storing and preserving various processing liquids to be used for the liquid processing in the coating and developing apparatus 1. Further, at a ceiling of the housing 21, a filter 28 is provided above the transfer mechanism 22 and a filter 29 is provided above the transfer mechanism 25 to respectively form down flows.

On the housing 21, FFUs 31, 32 and 33 are arranged in this order from left to right. The FFUs 32 and 33 supply air, which has been sucked, to the respective filters 28 and 29, and the filters 28 and 29 discharge the air backwards and downwards, respectively. The discharged air flows to, for example, the carrier block D1 so as to be exhausted. Further, the FFU 31 constituting a gas supply mechanism is connected to one end of a duct 34, and the other end of the duct 34 is extended downwards along a side wall of the housing 21 and connected to the filter 18 at the higher body portion 13 of the carrier block D1. That is, the air sucked by the FFU 31 is discharged downwards from the filter 18.

Three racks on each of which a plurality of carriers C can be placed in the forward-backward direction are provided above the higher body portion 13. Each rack is protruded from a side wall of the inspection block D2 and two lower racks are configured as carrier standby units 20 and an upper rack is configured as a carrier carry-in/out unit 19. The carrier carry-in/out unit 19 is a place where the carrier C is to be placed in order to deliver the carrier C to the external transfer mechanism such as the OHT or the like. Each of the carrier standby unit 20 is a place where the carrier C from which the wafer W has not yet been carried into the coating and developing apparatus 1 and the carrier C from which the wafer W has been carried out and to which the wafer W has not yet been returned are on standby. As such, the carrier carry-in/out unit 19 and the carrier standby units 20 constitute a temporary carrier placing unit where the carrier C is to be temporarily placed.

A non-illustrated transfer mechanism for the carrier C is provided above the lower body portion 12 of the carrier block D1. The transfer mechanism transfers the carrier C, which has been transferred to the carrier carry-in/out unit 19 by the external transfer mechanism, in sequence to the carrier stage 14, the carrier standby unit 20, the carrier stage 14 and the carrier carry-in/out unit 19. Further, the transferred carrier C is transferred from the carrier carry-in/out unit 19 to another apparatus by the external transfer mechanism.

Hereinafter, the processing block D3 will be described. As described above, the processing block D3 includes six layers stacked one above another, and these six layers are illustrated as unit blocks denoted by E1 to E6, respectively, from below. Further, two layers continuously stacked in the longitudinal direction are equipped with processing modules of the same type to perform the same processing on the wafer W. That is, the same processing may be performed between the unit blocks E1 and E2, the same processing may be performed between the unit blocks E3 and E4, and the same processing may be performed between the unit blocks E5 and E6.

In the processing block D3, a chemical liquid (coating solution) for coating film formation, a developing liquid and a cleaning liquid are supplied as processing liquids onto the wafer W, and, thus, a coating film is formed, developed and cleaned. As the coating film, an antireflection film, a resist film and a protective film are formed in this order on the surface of the wafer W. The protective film is formed to protect the resist film at the time of the liquid immersion exposure. Also, the cleaning in the processing block D3 is performed to clean a rear surface of the wafer W before the exposure in order to suppress a defocus caused by misalignment in the height of the wafer W due to a foreign substance adhering to the rear surface of the wafer W when the wafer W is placed on a stage of the exposure apparatus D5.

A liquid processing performed in each unit block E (E1 to E6) will be described. In the unit blocks E1 and E2, the antireflection film is formed as a lower layer of the resist film and the rear surface of the wafer W before the exposure is cleaned. In the unit blocks E3 and E4, the resist film and the protective film are formed, and in the unit blocks E5 and E6, the developing is performed. Therefore, the wafer W is transferred in sequence to the unit blocks E1 and E2, the unit blocks E3 and E4 and the unit blocks E5 and E6. The unit blocks E1 to E6 are partitioned from each other, and the wafer W is transferred to a transfer area separated for each unit block. As will be described in detail later, the transfer area is not separated on the right sides of the unit blocks E1 and E2.

A stack of the unit blocks E1 to E6 has a rectangular shape. Further, auxiliary equipment installation units 35 and 36 are arranged on the left and the right sides of the stack, so that the stack is interposed therebetween. The auxiliary equipment installation unit 35 is provided on the side with the inspection block D2, and provided in the housing 21 of the inspection block D2 to be located in front of the tower T1. Therefore, the auxiliary equipment installation unit 35 and the transfer mechanism 25 are arranged on the front and back sides of the tower T1, so that the tower T1 is interposed therebetween. The auxiliary equipment installation unit 36 is provided on the side with the interface block D4, and the position thereof will be described in detail later. The auxiliary equipment installation units 35 and 36 are blocks where auxiliary equipment of the liquid processing module in each unit block E is installed, and are provided in a height region ranging from the unit block E1 to the unit block E6.

The auxiliary equipment of the liquid processing module includes a cable that supplies an electric power to the corresponding module, an exhaust duct that forms an exhaust path for exhausting the inside of the cup constituting the module, a drain line that forms a drain path for drain out from the module and a supply line that forms a supply path for supplying the processing liquid to the module. With respect to the electric power supply cable, the exhaust duct, the drain line and the processing liquid supply line, ones corresponding to the liquid processing module on the left side of the unit block E are embedded to face the auxiliary equipment installation unit 35 downwards, and ones corresponding to the liquid processing module on the right side of the unit block E are embedded to face the auxiliary equipment installation unit 36 downwards.

Figure 5:
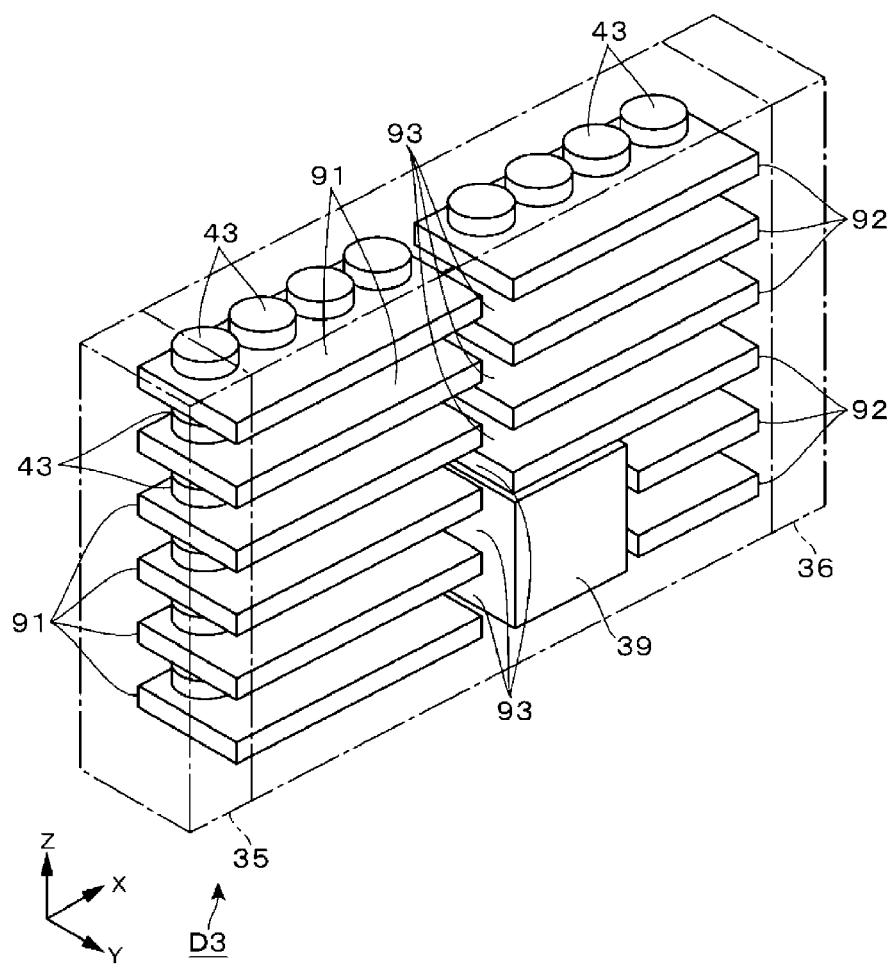
FIG. 5 is a perspective view of a front of a processing block provided in the coating and developing apparatus.

FIG. 5 illustrates a schematic configuration of the front of the processing block D3. The cup constituting the liquid processing module is provided on a base body divided on the left and right sides of the unit blocks E1 to E6, and a left-sided base body is denoted by 91 and a right-sided base body is denoted by 92. Further, a gap between the base bodies 91 and 92 of each unit block E is denoted by 93. Furthermore, in the unit blocks E1 and E2, an installation unit 39 of a processing liquid supply device to be described later is interposed between the base bodies 91 and 92, and a space between the installation unit 39 and the base body 91 is referred to as the gap 93. In each unit block E, the gap 93 is formed at a central portion in the left-right direction, and the gap 93 is used to place auxiliary equipment of developing modules which are liquid processing modules of the unit blocks E5 and E6. This will be described in detail later. The illustration of the base bodies 91 and 92 and the gap 93 is omitted in the drawings except for FIG. 5 and FIG. 8 that illustrates the configuration of the unit block E5 to be described later.

Figure 6:
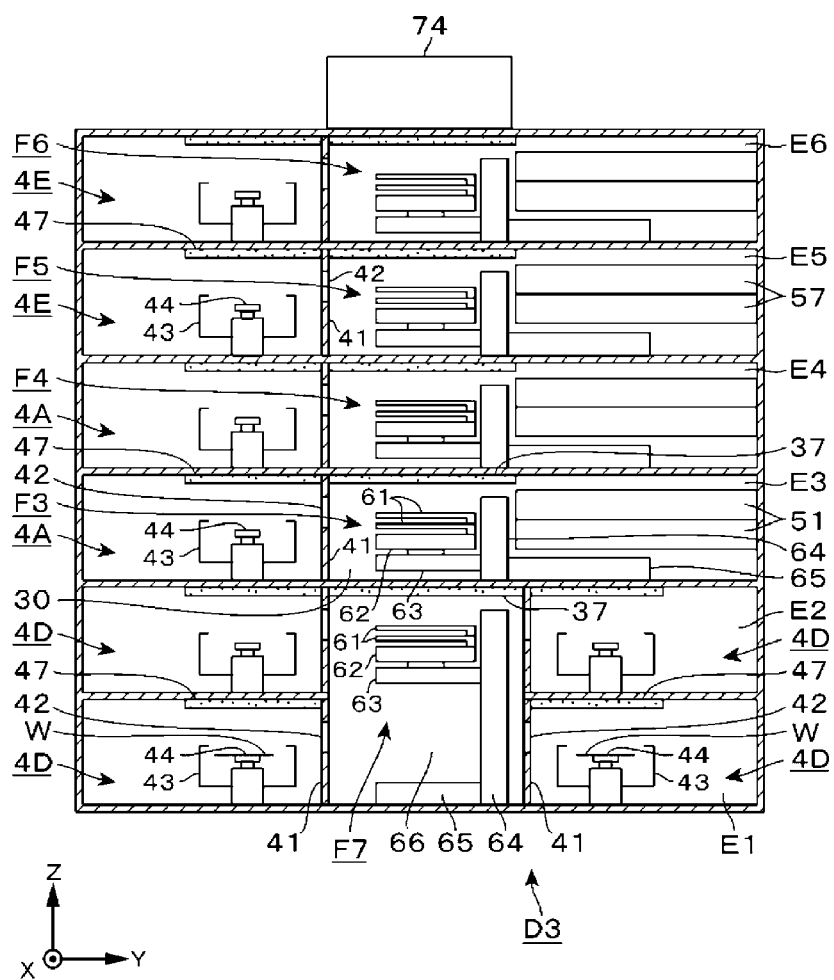
FIG. 6 is a longitudinal cross-sectional side view of the processing block.
Figure 7:
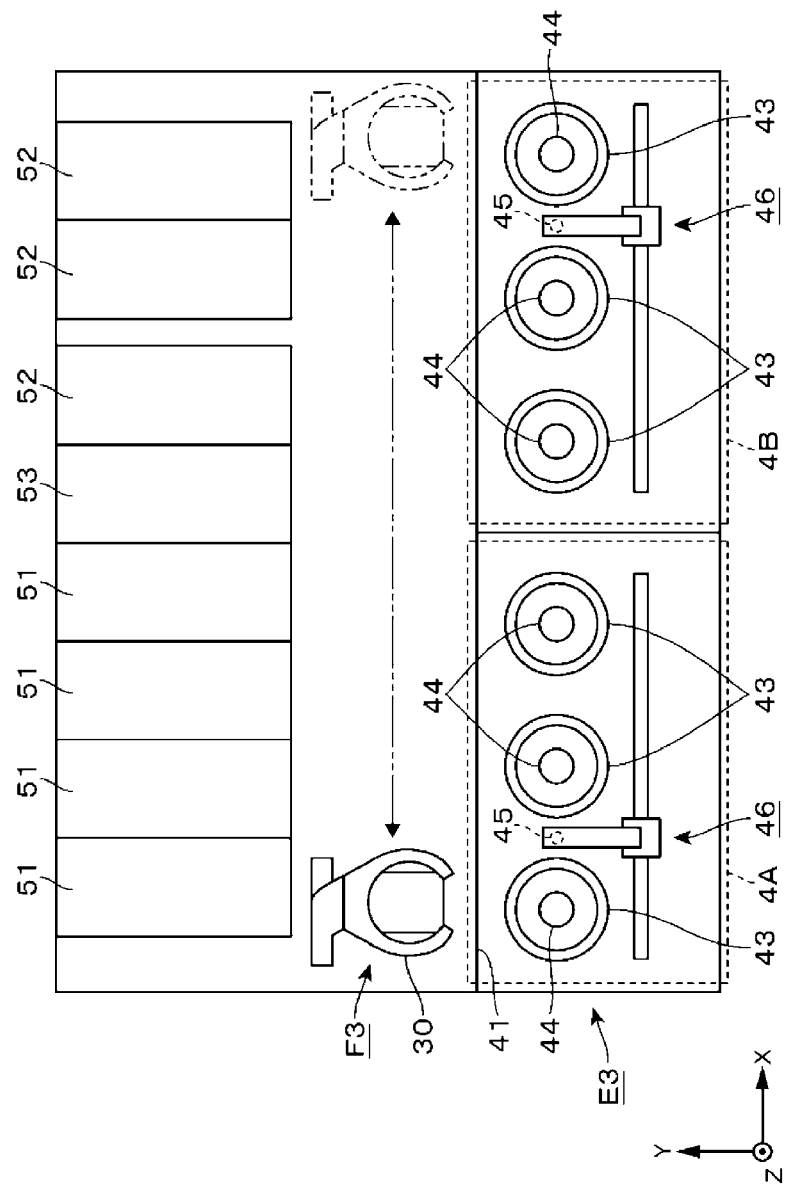
FIG. 7 is a plan view of a unit block for coating film formation provided in the processing block.

Hereinafter, each unit block will be described with reference to FIG. 6 that is a longitudinal cross-sectional side view of the processing block D3. First, the unit block E3 will be described. FIG. 7 is a plan view of the unit block E3. At a central portion in the forward-backward direction in the unit block E3, a transfer path (transfer area) 30 extended in the left-right direction is formed. A filter 37 is provided to form a down flow in the entire transfer path 30, and the filter 37 is placed at a ceiling of the unit block E3 in which the transfer path 30 is formed. A resist coating module 4A and a chemical liquid coating module 4B for protective film formation are provided on the left side and the right side, respectively, in front of the transfer path 30 so as to face the transfer path 30. Therefore, the resist coating module 4A and the chemical liquid coating module 4B are arranged in the left-right direction.

The resist coating module 4A includes a partition wall 41 that separates the resist coating module 4A from the transfer path 30 and another module, and the partition wall 41 is equipped with a wafer transfer port 42 (not illustrated in FIG. 7) facing the transfer path 30 in order to transfer the wafer W into a cup 43 to be described later. The resist coating module 4A includes three cups 43 each accommodating the wafer W and arranged in the left-right direction, and a spin chuck 44 configured to attract and hold the rear surface of the wafer W and rotate the wafer W is provided in each cup 43. The cup 43 is connected to an exhaust source such as an exhaust path in the factory via the exhaust duct which is one of the auxiliary equipment and the inside of the cup 43 is exhausted. That is, the resist coating module 4A is exhausted by the cup 43. Further, the cup 43 is connected to the drain line which is one of the auxiliary equipment. Furthermore, the resist coating module 4A is equipped with a nozzle 45 shared by the three cups 43 and configured to discharge a resist to the surface of the wafer W. The nozzle 45 is moved from above the wafer W in each cup 43 and a non-illustrated standby area provided, for example, between the cups 43 by a nozzle moving mechanism 46.

Further, a filter 47 is provided to overlap the three cups 43, and the filter 47 is placed at the ceiling of the unit block E3 so as to form a down flow toward the cups 43. Furthermore, the resist coating module 4A is provided on the left side of the unit block E3, and, thus, the auxiliary equipment thereof is provided in the auxiliary equipment installation unit 35 as described above.

The chemical liquid coating module 4B for protective film formation has the same configuration as the resist coating module 4A except that instead of the resist, the chemical liquid for protective film formation is discharged from the nozzle 45 and the auxiliary equipment thereof is provided in the auxiliary equipment installation unit 36. Also, the cups 43 of the resist coating module 4A and the cups 43 of the chemical liquid coating module 4B are provided on the base body 91 and the base body 92, respectively, described above with reference to FIG. 5.

Vertical two-stage processing modules are stacked one above another behind the transfer path 30 so as to face the transfer path 30, and eight stacks of these processing modules are arranged in parallel with each other in the left-right direction to form a processing module group. Examples of modules constituting the processing module group may include a plurality of heating modules 51, a plurality of heating modules 52 and an inspection module 53. Each of the heating modules 51 and 52 includes a heating plate and is configured to heat the wafer W placed on the heating plate to remove a solvent in the coating film. The heating module 51 is configured to heat the wafer W on which the resist film has been formed but the protective film has not yet been formed, and the heating module 52 is configured to heat the wafer W on which the protective film has been formed. The inspection module 53 takes an image of the wafer W to inspect the resist film on the wafer W heated by the heating module 51.

The unit block E3 is equipped with a transfer mechanism F3. The transfer mechanism F3 delivers the wafer W to each of the modules facing the front side and the back side of the transfer path 30, the modules of the tower T1 corresponding in height to the unit block E3, and modules of a tower T2, which will be described later, corresponding in height to the unit block E3 and provided in the interface block D4. The transfer mechanism F3 includes two holding bodies 61 each holding the wafer W, a moving body 62 configured to independently move the holding bodies 61 in the forward-backward direction, a rotation unit 63 configured to move the moving body 62 around the vertical axis, an elevation unit 64 configured to move the rotation unit 63 in the vertical direction and a moving mechanism 65 including a driving shaft configured to move the elevation unit 64 in the left-right direction.

The holding bodies 61, the moving body 62, the rotation unit 63 and the elevation unit 64 are provided in the transfer path 30, and the moving mechanism 65 is provided under the processing module group behind the transfer path 30. The transfer path 30 is exhausted through a wafer transfer port (not illustrated) formed in the processing module group and an area where the moving mechanism 65 is provided. That is, the transfer path 30 is configured to be exhausted from the back side. Further, the transfer mechanism 17 of the carrier block D1 has the same configuration as transfer mechanism F3 except that the moving mechanism 65 makes a movement in a different direction, and the transfer mechanisms 22 and 25 of the inspection block D2 have the same configuration as the transfer mechanism F3 except that the moving mechanism 65 is not provided.

The unit block E4 has the same configuration as the unit block E3, and a transfer mechanism corresponding to the transfer mechanism F3 is denoted by F4.

Hereinafter, differences between the unit blocks E1 and E2 and the unit blocks E3 and E4 will be described. FIG. 1 illustrates a plan view of the unit block E1, and in addition to FIG. 2 and FIG. 3 illustrating longitudinal cross-sectional front views and FIG. 6 illustrating a longitudinal cross-sectional side view, FIG. 1 will also be referred to. The left sides of the unit blocks E1 and E2 have the same configuration, and instead of the resist coating module 4A, a chemical liquid coating module 4C for antireflection film formation is provided in front of the transfer path 30 of each of the unit blocks E1 and E2 so as to face the transfer path 30. The chemical liquid coating module 4C has the same configuration as the resist coating module 4A except that instead of the resist, a chemical liquid for antireflection film formation is discharged from the nozzle 45.

Further, in the unit blocks E1 and E2 as in the unit block E3, stacks of vertical two-stage processing modules are arranged in the left-right direction to form a processing module group behind the transfer path 30. However, only five stacks of the processing modules are provided in each of the unit blocks E1 and E2 and placed on the left sides of the unit blocks E1 and E2. The processing module group may include, for example, a plurality of hydrophobic processing modules 54, a plurality of heating modules 55 and an inspection module 56. Each of the hydrophobic processing modules 54 includes a heating plate on which the wafer W is to be placed and heated; and a gas supply configured to supply a gas for hydrophobic processing to the surface of the wafer W heated on the heating plate. Each of the heating modules 55 has the same configuration as the heating modules 51 and 52 and is configured to heat the wafer W on which the antireflection film has been formed to remove a solvent in the film. The inspection module 56 takes an image of the wafer W to inspect the wafer W on which the antireflection film has been formed.

Transfer mechanisms F1 and F2 corresponding to the transfer mechanism F3 are provided on the left sides of the unit blocks E1 and E2, respectively. The transfer mechanism F1 accesses each of the processing module group behind the transfer path 30 in the unit block E1, the chemical liquid coating module 4C in the unit block E1, and the modules of the tower T1 corresponding in height to the unit block E1 and delivers the wafer W between these modules. The transfer mechanism F2 delivers the wafer W as in the transfer mechanism F1 except that the transfer mechanism F2 accesses the modules inside the unit block E2 and the modules of the tower T1 corresponding in height to the unit block E2.

The transfer paths 30 communicate with each other between the unit blocks E1 and E2. That is, the right side of the unit block E1 does not have a ceiling for partitioning the transfer path 30. Hereinafter, transfer paths (transfer areas) communicating in the vertical direction on the right sides of the unit blocks E1 and E2 are referred to as a common transfer path 66 and distinguished from the transfer path 30 separated between the unit blocks E1 and E2 on the left sides of the unit blocks E1 and E2. As such, the unit block E1 does not have the ceiling for partitioning the transfer path 30, and, thus, the filter 37 of the unit block E2 forms a down flow in the common transfer path 66. The transfer mechanisms F1 and F2 move along only the transfer path 30 between the transfer path 30 and the common transfer path 66 to deliver the wafer W.

Rear surface cleaning modules 4D configured to clean the rear surface of the wafer W are provided as cleaning modules in the right sides of the unit blocks E1 and E2, and the rear surface cleaning modules 4D are provided in front of and behind the common transfer path 66 so as to face the common transfer path 66. Therefore, the rear surface cleaning modules 4D and the chemical liquid coating modules 4C are arranged in the left-right direction in front of the unit blocks E1 and E2. The rear surface cleaning module 4D has substantially the same configuration as the resist coating module 4A, and in terms of differences between the rear surface cleaning module 4D and the resist coating module 4A, two cups 43 are arranged in the left-right direction of the rear surface cleaning module 4D. As in the resist coating module 4A, a down flow from the filter 37 at a ceiling of the unit block is formed toward the cups 43.

Inside each cup 43, a non-illustrated nozzle configured to discharge the cleaning liquid to the rear surface of the wafer W being rotated is provided in addition to the spin chuck 44. Unlike the resist coating module 4A, the rear surface cleaning module 4D is not equipped with the nozzle 45 configured to supply the coating solution to the surface of the wafer W and a nozzle moving mechanism 48 corresponding to the nozzle 45. Since the rear surface cleaning module 4D is not equipped with the nozzle 45, a standby area for the nozzle 45 is not provided. Therefore, the distance between the cups 43 in the rear surface cleaning module 4D is smaller than the distance between the cups 43 in the resist coating module 4A and the chemical liquid coating modules 4B and 4C. However, the rear surface cleaning module 4D is configured to perform the processing without reversing the wafer W. Specifically, the wafer W whose rear surface faces downwards is transferred to the rear surface cleaning module 4D and the rear surface of the wafer w is held on a holder. Further, a brush is provided inside the cup 43 of the rear surface cleaning module 4D. The rear surface of the wafer W held on the holder is cleaned by supplying the cleaning liquid to the rear surface of the wafer W from the nozzle inside the cup 43 and sliding the brush. Furthermore, the holder that holds the rear surface of the wafer W includes the spin chuck 44 and a non-illustrated holding mechanism configured to hold a different portion in the rear surface of the wafer W from the spin chuck 44 and sequentially holds the wafer W, so that the entire rear surface of the wafer W can be cleaned.

Herein, the two cups 43 of the rear surface cleaning module 4D are provided on the above-described base body 92, and the base body 92 is shared by the cups 43. Therefore, the spin chuck 44 inside the cup 43, a rotation mechanism configured to rotate the spin chuck 44 and a nozzle configured to discharge the cleaning liquid to the rear surface of the wafer W are also provided on the base body 92. Since the plurality of cups 43 is provided on the common base body 92, it is possible to suppress the inconvenience such as adjustment of the levelness of each spin chuck 44 at the time of maintenance. Further, for example, a part of an electric power supply system that supplies electric power to the rotation mechanism and the nozzle moving mechanism is shared by the cups 43 to be provided on the base body 92. As such, the plurality of cups 43 is provided on the base body 92, so that a necessary component for performing the processing can be shared by the cups 43, which can result in reduction of manufacturing cost of the coating and developing apparatus 1 including the rear surface cleaning module 4D.

Each of the electric power supply cable, the exhaust duct, the drain line and the processing liquid supply line as the auxiliary equipment of the rear surface cleaning module 4D behind the common transfer path 66 is embedded in a space outside the arrangement of the cups 43. In contrast, each of the electric power supply cable, the exhaust duct, the drain line and the processing liquid supply line of the rear surface cleaning module 4D in front of the common transfer path 66 is embedded in the auxiliary equipment installation unit 36.

In each of the unit blocks E1 and E2, the installation unit 39 of the processing liquid supply device is provided between the chemical liquid coating module 4C for antireflection film formation and the rear surface cleaning module 4D in front of the transfer path 30. The processing liquid supply device includes a pump and a valve for supplying the processing liquid to each of the resist coating module 4A, the chemical liquid coating module 4B, the chemical liquid coating module 4C, the rear surface cleaning module 4D, and a developing module and a post-exposure cleaning module to be described later. That is, each processing liquid stored and preserved in the liquid reservoir area 26 of the inspection block D2 is supplied by the pump of the installation unit 39 to each of the liquid processing modules via the installation unit 39.

In the unit blocks E1 and E2, a transfer mechanism F7 shared by the unit blocks E1 and E2 is provided. The transfer mechanism F7 accesses each of the rear surface cleaning modules 4D in the unit blocks E1 and E2 and the modules of the tower T2 in the interface block D4 corresponding in height to the unit blocks E1 and E2 and delivers the wafer W between these modules. That is, the transfer mechanism F7 moves along only the common transfer path 66 between the transfer path 30 and the common transfer path 66 to deliver the wafer W.

The transfer mechanism F7 has substantially the same configuration as the transfer mechanisms F1 to F4 except that a vertically movable distance of the holding body 61 of the transfer mechanism F7 is greater than a vertically movable distance of the holding bodies 61 of the transfer mechanisms F1 to F4, so that the transfer mechanism F7 can access the rear surface cleaning module 4D at each height position. Further, the moving mechanism 65 of the transfer mechanism F7 is provided at the bottom of the common transfer path 66 as shown in FIG. 6.

In the rear surface cleaning module 4D, the cup 43 is provided at a sufficient height to suppress scattering of the liquid to the outside and the rotation mechanism is provided under the spin chuck 44. As a result, the module has a greater height than each module constituting the processing module group behind the transfer path 30. Meanwhile, to transfer the wafer W from above the cup 43, the transfer mechanism F7 accesses the rear surface cleaning module 4D from a relatively high position. That is, even if the moving mechanism 65 of the transfer mechanism F7 is provided at the bottom of the common transfer path 66, the access to the rear surface cleaning module 4D of the unit block E1 is not hindered. Further, in some cases, the clean room equipped with the coating and developing apparatus 1 needs to have a relatively small height and the unit block E needs to have a relatively small height. Therefore, the moving mechanism 65 is provided in the common transfer path 66 but does not overlap the rear surface cleaning module 4D, which enables the rear surface cleaning module 4D to be provided behind the common transfer path 66 in the unit block E1 and thus increases the number of rear surface cleaning module 4D to be provided.

Hereinafter, the unit block E5 will be described with reference to a plan view of FIG. 8 in terms of differences from the unit block E3. A module group behind the transfer path 30 includes, for example, a heating module and an inspection module 59. The heating module includes a plurality of heating modules 57 configured to perform heating of the wafer W after the exposure (so-called post exposure bake (PEB)) and a plurality of heating modules 58 configured to perform heating of the wafer W after developing, and each of the heating modules has the same configuration as the heating module 51. The inspection module 59 takes an image of the wafer W to inspect the wafer W heated by the heating module after the developing. Also, in the unit block E5, a transfer mechanism corresponding to the transfer mechanism F3 of the unit block E3 is denoted by F5.

In the unit block E5, instead of the resist coating module 4A and the chemical liquid coating module 4B, a first developing module 4E and a second developing module 4F are provided in front of the transfer path 30. The first developing module 4E is configured to supply a developing liquid for developing a positive resist to the wafer W, and the second developing module 4F is configured to supply a developing liquid for developing a negative resist to the wafer W. The wafer W is processed by any one of the first developing module 4E and the second developing module 4F depending on the type of the resist film formed thereon. In this example, five first developing modules 4E are arranged in the left-right direction on the left side of the unit block E5, and three second developing modules 4F are arranged in the left-right direction on the right side of the unit block E5. Therefore, eight developing modules are provided. The four left-side developing modules are provided on the base body 91 and the four right-side developing modules are provided on the base body 92.

Like the resist coating module 4A, the first developing module 4E includes the cup 43 and the spin chuck 44, but only one cup 43 and only one chuck 44 are provided in the first developing module 4E. A nozzle for supplying the developing liquid to the surface of the wafer W is moved from the standby area on the front side to above the cup to process the wafer W, but the illustration of the nozzle is omitted. The second developing module 4F has the same configuration as the first developing module 4E except the type of the developing liquid. The distance between the cups 43 in the four left-side developing modules and the distance between the cups 43 in the four right-side developing modules are smaller than the distance between the cups 43 in the liquid processing modules described above, and more cups 43 are placed in the unit block E5 than in the unit blocks E1 to E4.

Figure 8:
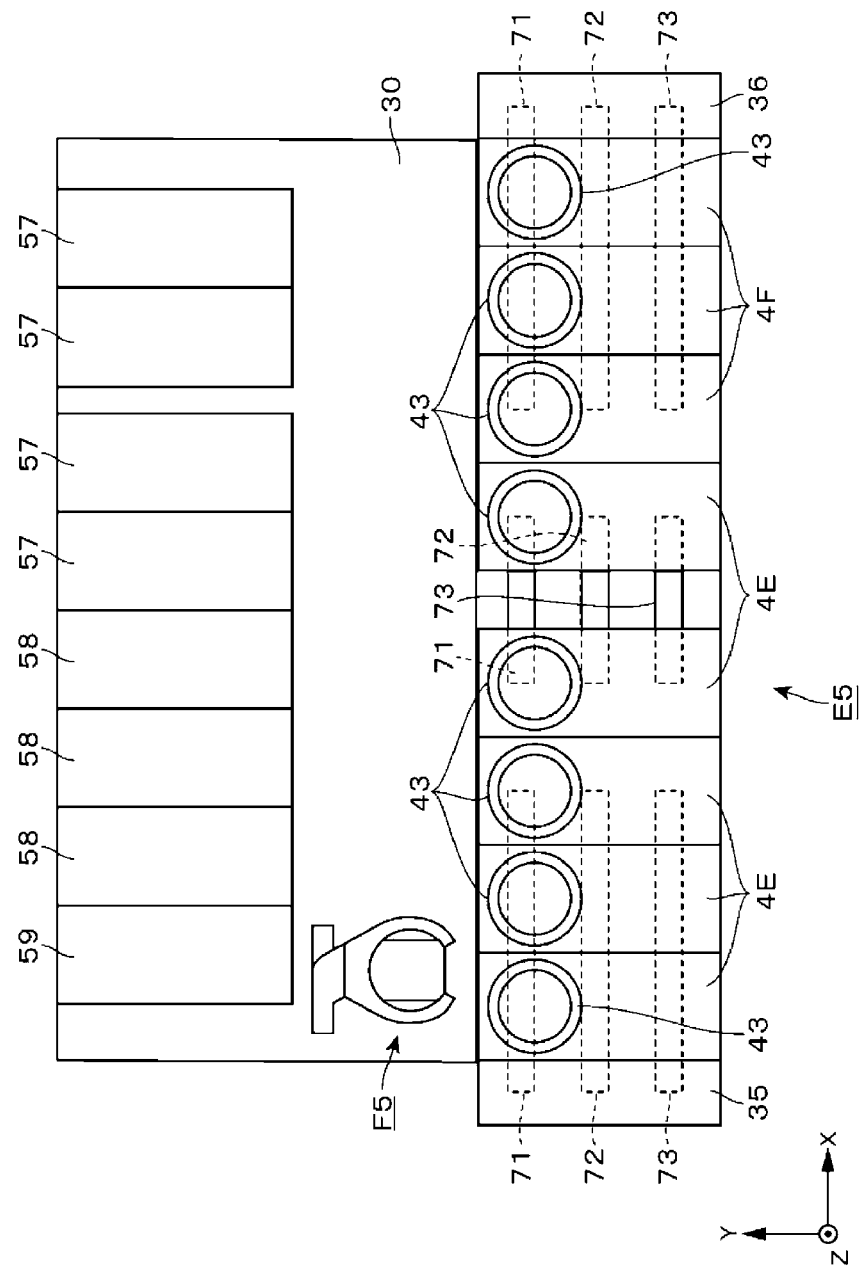
FIG. 8 is a plan view of a unit block for development provided in the processing block.

FIG. 8 schematically illustrates the auxiliary equipment of the developing modules (the first developing module 4E and the second developing module 4F). As the auxiliary equipment, an exhaust duct as an exhaust path forming member connected to the cup 43 of the developing module is denoted by 71, an electric power supply cable connected to the developing module is denoted by 72, and a developing liquid supply line connected to the developing module is denoted by 73.

Among the eight developing modules, three first developing modules 4E on the left end side share the exhaust duct 71, the electric power supply cable 72 and the developing liquid supply line 73. More specifically, the exhaust duct 71 is provided for each module on an upstream side so as to be connected to each of the three modules and joined on a downstream side so as to be shared by the three modules, and the shared portion is taken out from the unit block E5 to the auxiliary equipment installation unit 35 and faces a lower part of the apparatus. Like the exhaust duct 71, each of the electric power supply cable 72 and the developing liquid supply line 73 is provided for each module on an upstream side and joined so as to be shared and the shared portion is taken out to the auxiliary equipment installation unit 35 and faces the lower part of the apparatus.

Further, in three second developing modules 4F on the right end side among the eight developing modules, the exhaust duct 71, the electric power supply cable 72 and the developing liquid supply line 73 have the same configurations as those of the developing modules on the left end side. That is, each of the auxiliary equipment is shared by the three developing modules, and the shared portion is take out from the unit block E5 to the auxiliary equipment installation unit 36 and faces the lower part of the apparatus.

Furthermore, among the eight developing modules, two first developing modules 4E on a central side share the exhaust duct 71, the electric power supply cable 72 and the developing liquid supply line 73. The shared portion passes through the gap 93 between the base bodies 91 and 92 described above with reference to FIG. 5 and passes through the gap 93 between the base bodies 91 and 92 in the lower unit block E and then is taken out toward the lower part of the apparatus. Although illustration of the drain line connected as one of the auxiliary equipment to the cup 43 of each developing module is omitted, the drain line is also divided and embedded in the unit block E5 in the same manner as the above-described exhaust duct 71 and the like.

As described above, in the unit block E5, the auxiliary equipment is divided into three parts: the three developing modules on the left side; the two developing modules on the central side; and the three developing modules on the right side. Therefore, the developing modules on the left side, the central side and the right side are exhausted by respective exhaust ducts, and, thus, it is possible to suppress the non-uniformity in the distance between the exhaust source connected to the exhaust ducts and each developing module. Accordingly, the cup 43 in each developing module can be exhausted with high uniformity. Therefore, it is possible to suppress a lack of exhaust performance caused when a specific cup 43 is located far from the exhaust source and also possible to increase the uniformity of processing in each developing module.

As the exhaust duct is divided into three parts, each of the electric power supply cable 72, the developing liquid supply line 73 and the drain line is also divided into three parts. Therefore, if abnormality occurs in any one developing module, only a developing module sharing the auxiliary equipment stops the operation thereof and needs to be subjected to maintenance. That is, there is no need to stop the operations of the other developing modules, which do not share the auxiliary equipment, for maintenance, and, thus, it is possible to continue the processing and thus possible to suppress the decrease in the throughput.

The unit block E6 has the same configuration as the unit block E5, and in the unit block E6, a transfer mechanism corresponding to the transfer mechanism F3 of the unit block E3 is denoted by F6. An FFU 74 (see FIG. 6) is provided at an upper portion of the unit block E6, i.e., at an upper portion of the processing block D3. Air sucked by the FFU 74 is supplied to the filter 37 provided on the transfer path 30 of the unit blocks E1 to E6 and the common transfer path 66 of the unit blocks E1 and E2 and the filter 47 on the liquid processing modules through a non-illustrated duct to form a downward flow. The FFU 74 and the cup 43 of each unit block E constitutes a gas supply/exhaust unit.

Figure 9:
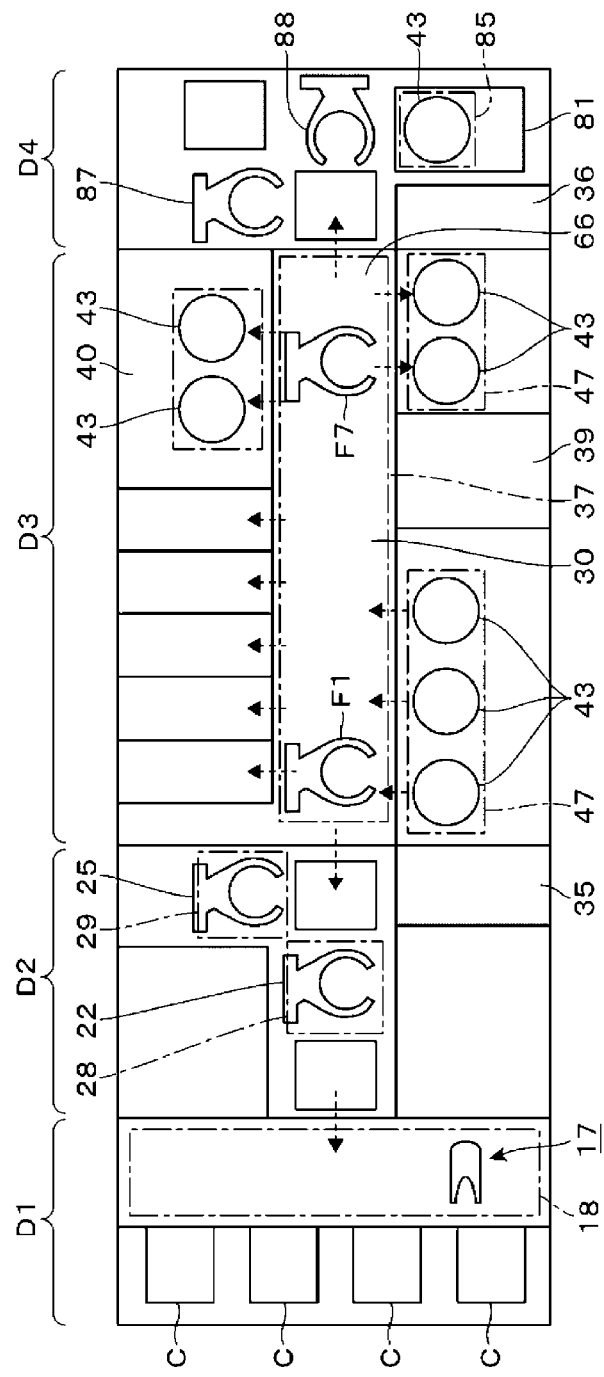
FIG. 9 is a schematic plan view of the coating and developing apparatus.
Figure 10:
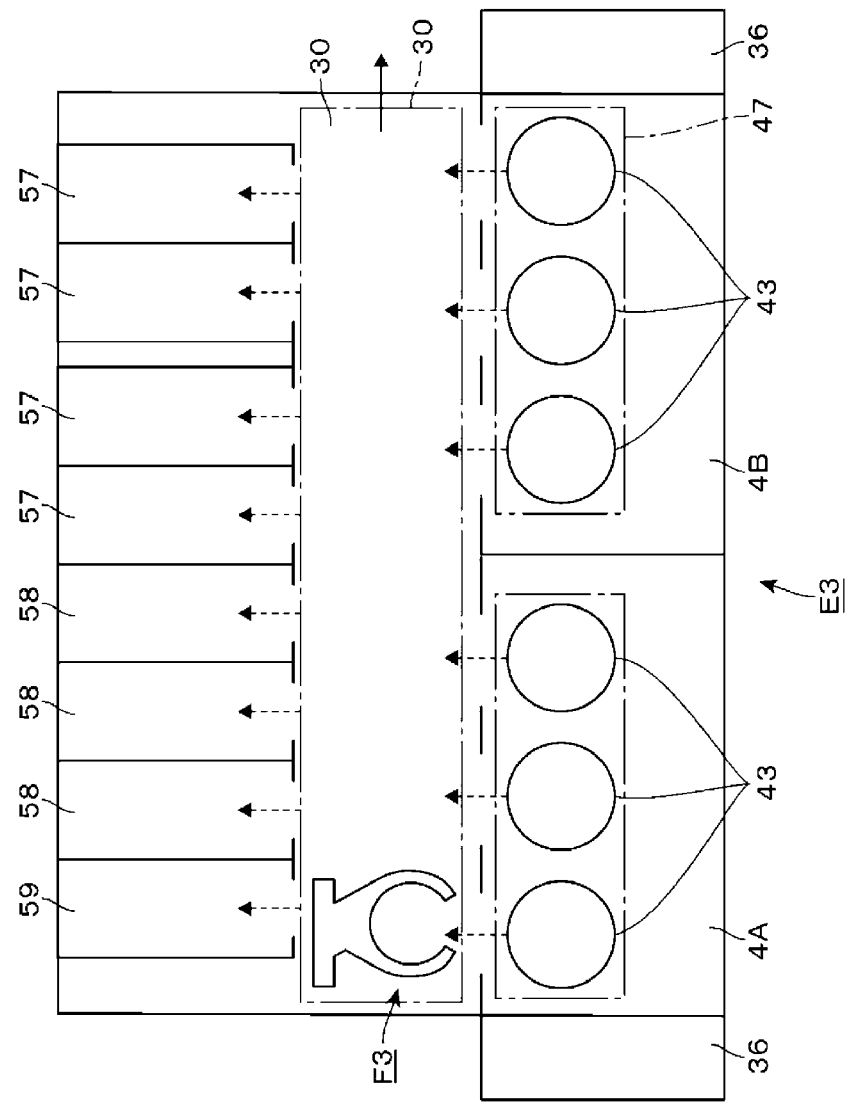
FIG. 10 is a schematic plan view of a unit block for coating film formation provided in the processing block.

In each unit block E, a pressure distribution is formed by the exhaust from behind the transfer path 30 and from the cup 43 of the liquid processing module and the supply of air from each of the filters 37 and 47. This pressure distribution will be described with reference to schematic plan views of FIG. 9 and FIG. 10. FIG. 9 illustrates the blocks D1 to D4 including the unit block E1, and FIG. 10 illustrates the unit block E3. In these drawings, the direction of air flow formed by the pressure distribution is indicated by an arrow.

In the unit blocks E1 and E2, air is supplied and exhausted in each unit as described above, and, thus, the pressure of the transfer path 30 and the common transfer path 66 is controlled to be lower than the pressure of the chemical liquid coating module 4C for antireflection film formation and higher than the pressure of the rear surface cleaning module 4D. The reason for controlling the pressure of each unit will be described. Desirably, the chemical liquid coating module 4C for forming the coating film needs to have a high degree of cleanliness in order to suppress defects caused by particles mixed in the coating film. Therefore, air flow is formed from the chemical liquid coating module 4C toward the transfer path 30 in order to suppress the particles from being introduced into the chemical liquid coating module 4C from the transfer path 30 and the common transfer path 66. Meanwhile, the rear surface cleaning module 4D does not perform the film formation and thus has a lower risk of having abnormality in the processing caused by the particles introduced from the transfer path 30 and the common transfer path 66 than the chemical liquid coating module 4C. Therefore, the air flow is formed from the common transfer path 66 toward the rear surface cleaning module 4D in order to more reliably suppress mist generated when the wafer W is cleaned from adhering to the wafer W through the common transfer path 66 and the transfer path 30. The above-described pressure distribution is formed among the transfer path 30 and the common transfer path 66, the chemical liquid coating module 4C and the rear surface cleaning module 4D to form the air flow as described above.

Meanwhile, in the unit blocks E3 and E4, the pressure of the transfer path 30 is controlled to be higher than the pressure of the resist coating module 4A and the chemical liquid coating module 4B in order to suppress the particles from being mixed into the coating film. That is, as shown in FIG. 10, air flows from the resist coating module 4A and the chemical liquid coating module 4B to the transfer path 30. In the unit blocks E5 and E6, the pressure of the transfer path 30 is controlled to be lower than the pressure of the first developing module 4E and the second developing module 4F, so that it is possible to suppress the particles from adhering to the wafer W during the developing. Also, as shown in FIG. 9 and FIG. 10, the air supplied to the transfer path 30 and the common transfer path 66 in each unit block E is removed by being introduced into the inspection block D2 and the interface block D4 as well as by being exhausted from behind the transfer path 30 or from the cup 43 of the rear surface cleaning module 4D.

The unit blocks E1 and E2 serve as a first unit block. Further, the unit blocks E3 to E6 serve as a second unit block. The unit blocks E3 and E4 serve as a unit block for outgoing path and the unit blocks E5 and E6 serve as a unit block for incoming path. The transfer path 30 and the common transfer path 66 of the unit blocks E1 and E2 serve as a first substrate transfer region and the transfer path 30 of the unit blocks E3 and E4 serves as a second substrate transfer region. The transfer mechanisms F1 and F2 serve as a first transfer mechanism, the transfer mechanism F7 serves as a second transfer mechanism, and the transfer mechanisms F3 to F6 serve as a third transfer mechanism. The chemical liquid coating module 4C for antireflection film formation serves as a first processing module, the rear surface cleaning module 4D serves as a second processing module, and the resist coating module 4A and the chemical liquid coating module 4B for protective film formation serve as a third processing module. Further, the first developing module 4E and the second developing module 4F serve as a fourth processing module.

Figure 2:
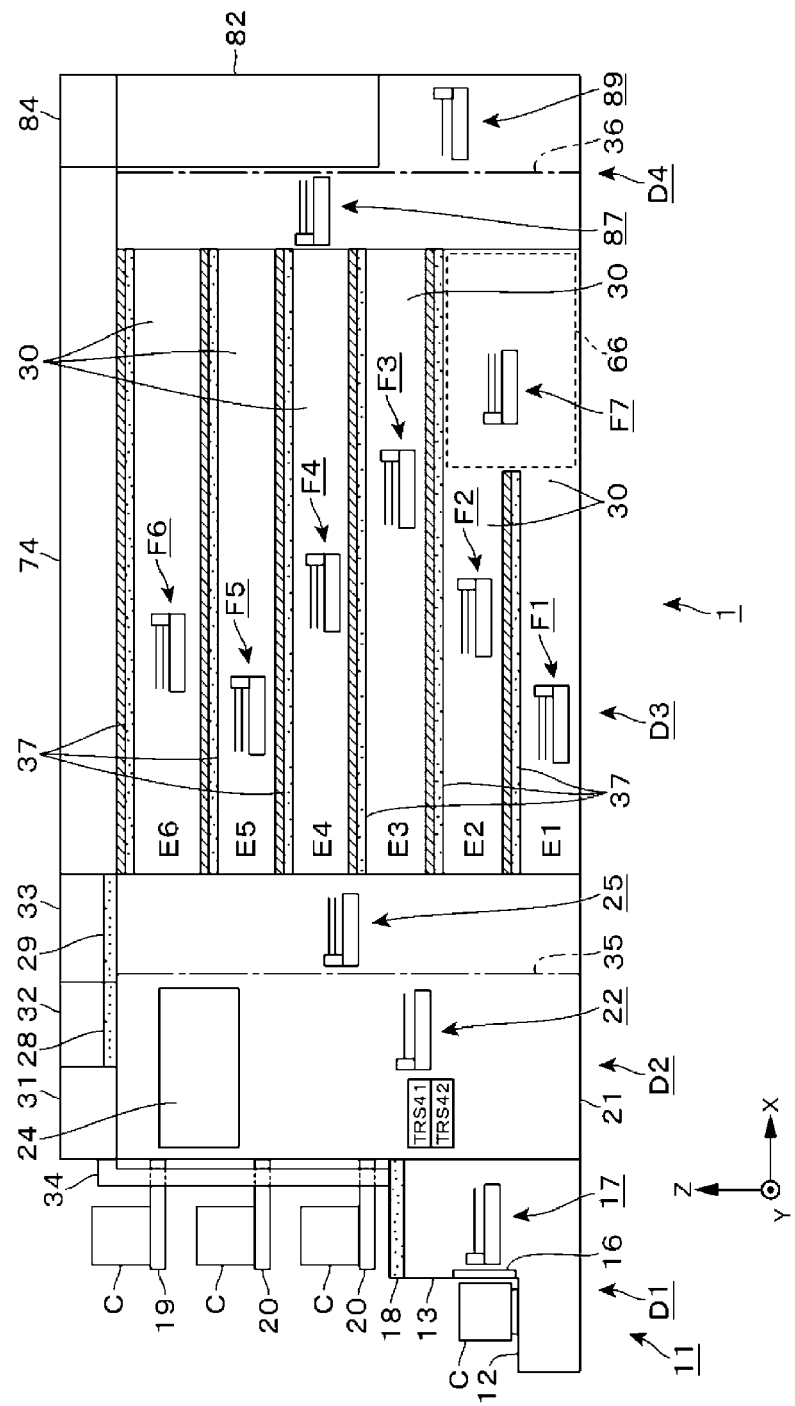
FIG. 2 is a longitudinal cross-sectional front view of the coating and developing apparatus.
Figure 3:
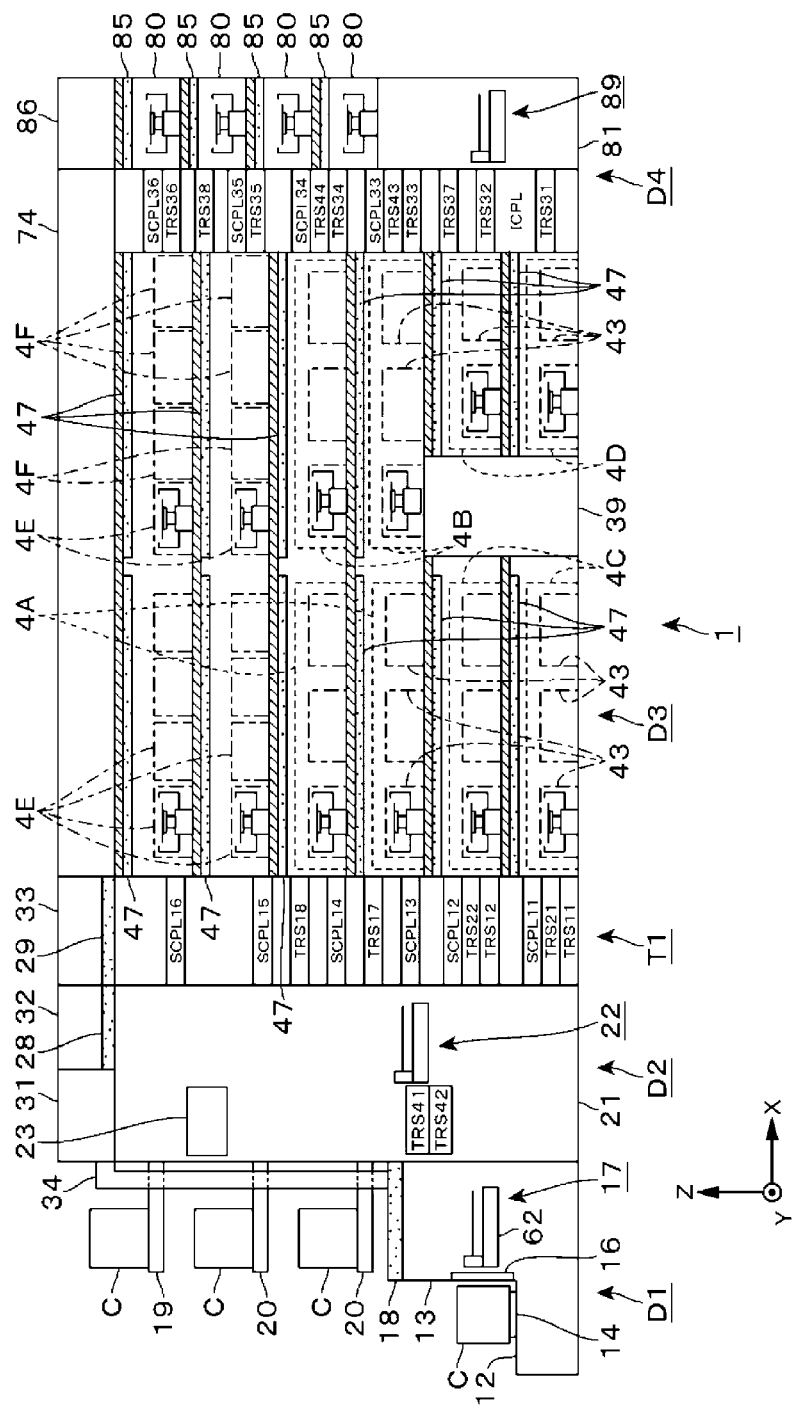
FIG. 3 is a longitudinal cross-sectional front view of the coating and developing apparatus.
Figure 11:
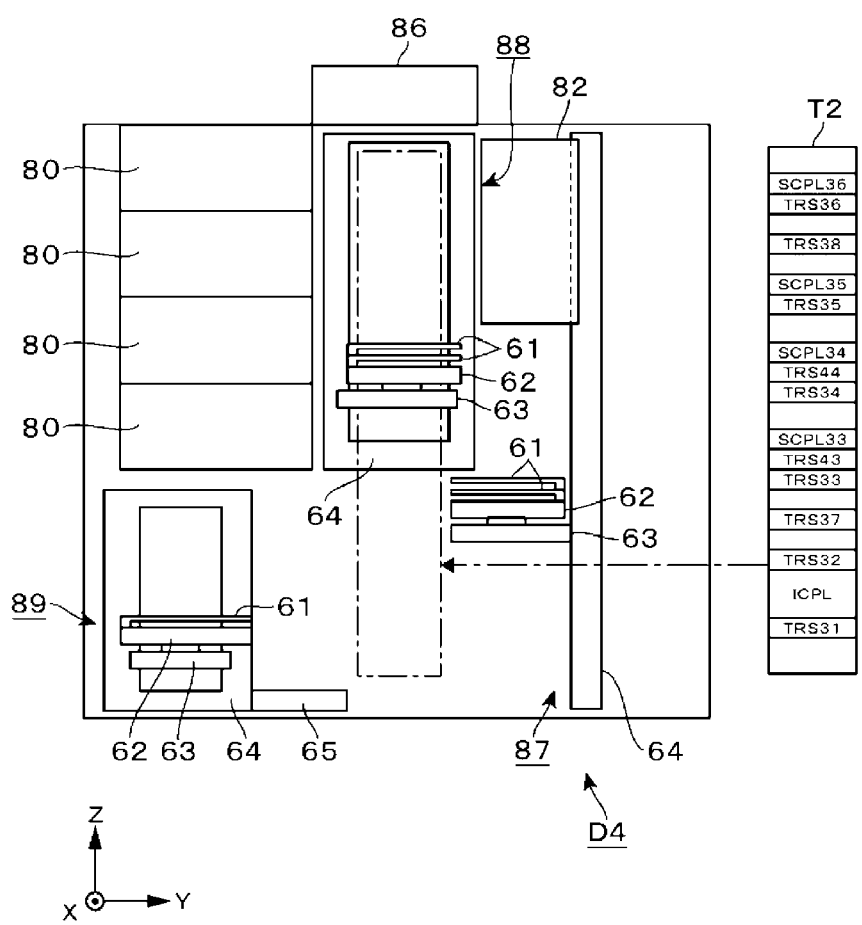
FIG. 11 is a longitudinal cross-sectional side view of an interface block in the coating and developing apparatus.

Hereinafter, the interface block D4 will be described with reference to FIG. 11 illustrating a longitudinal cross-sectional side view of the interface block D4 in addition to FIG. 1 illustrating the plan view and FIG. 2 and FIG. 3 illustrating longitudinal the cross-sectional front views. The interface block D4 includes a housing 81. At a central portion in the forward-backward direction inside the housing, the tower T2 is provided on the side with the processing block D3. The tower T2 is located behind the above-described auxiliary equipment installation unit 36 provided in the housing 81. The tower T2 includes a plurality of delivery modules TRS and a plurality of temperature control modules SCPL which are stacked one above another, and these modules constitute the other side placing units. Also, a temperature control module for adjusting the temperature of the wafer W before being carried into the exposure apparatus D5 is provided at a lower portion of the tower T2 and this temperature control module is denoted by ICPL. Further, in FIG. 11, the original position of the tower T2 is indicated by a chain line for convenience of illustration, and the tower T2 is indicated by a solid line outside the interface block D4, so that the modules included in the tower T2 can be clearly seen.

At an upper portion of the interface block D4, four post-exposure cleaning modules 80 are arranged, for example, in a longitudinal direction on the right side of the auxiliary equipment installation unit 36. The post-exposure cleaning module 80 has a rectangular shape when viewed from the top and has a long side along the forward-backward direction to reduce the length of the interface block D4 in the left-right direction. The post-exposure cleaning module 80 has the same configuration as the developing module except that the post-exposure cleaning module 80 supplies, instead of the developing liquid, the cleaning liquid for removing the protective film and cleaning the surface of the wafer W onto the surface of the wafer W.

Further, a vertically long buffer module 82 is provided behind and on the right side of the tower T2 and located at the upper portion of the interface block D4. Therefore, the buffer module 82 is located deviating from rows of the TRS and SCPL included in the tower T2. The buffer module 82 serving as a staying module is configured to place the wafer W which has not yet been processed by the rear surface cleaning module 4D, and more wafers W can be placed and held in the buffer module 82 than in the delivery module TRS.

Further, the interface block D4 includes transfer mechanisms 87, 88 and 89 that serve as the other side transfer mechanism. The transfer mechanisms 87 and 88 includes the same components as the transfer mechanisms F1 to F7 except the moving mechanism 65 is not provided. The transfer mechanism 87, which is one of the transfer mechanisms and serves as a second other-side transfer mechanism, is located behind the tower T2. Therefore, the tower T2 is interposed between the transfer mechanism 87 and the auxiliary equipment installation unit 36 in the forward-backward direction. The transfer mechanism 87 accesses the delivery module TRS, the temperature control module SCPL and the temperature control module ICPL at each height position in the tower T2, and the buffer module 82 to deliver the wafer W between these modules.

Furthermore, the transfer mechanism 88, which serves as a first other-side transfer mechanism, is provided on the right side of the tower T2 and accesses the buffer module 82 and each of the delivery module TRS and the temperature control module SCPL at an upper portion of the tower T2 to deliver the wafer W between these modules. That is, the transfer mechanism 88 delivers the wafer W at the upper portion of the interface block D4, whereas the transfer mechanism 87 delivers the wafer W between the upper portion and a lower portion of the interface block D4. For this reason, a vertically movable distance of a holding body 61 of the transfer mechanism 87 is greater than a vertically movable distance of a holding body 61 of the transfer mechanism 88. That is, a wafer transfer region of the transfer mechanism 87 is longer in the longitudinal direction than a wafer transfer region of the transfer mechanism 88. The buffer module 82, the transfer mechanism 88 and the post-exposure cleaning module 80 are arranged in a row in the forward-backward direction when viewed from the top.

The transfer mechanism 89 is provided under the post-exposure cleaning module 80 and a moving mechanism 65 constituting the transfer mechanism 89 is provided to move each component, such as a holding body 61, in the forward-backward direction. The transfer mechanism 89 accesses the delivery module TRS and the temperature control module ICPL provided at the lower portion of the tower T2 to deliver the wafer W between these modules.

The delivery modules TRS and the temperature control modules SCPL provided in the tower T2 will be described in more detail. Among the delivery modules TRS, some delivery modules located corresponding in height to the unit blocks E1 to E6 and used to deliver the wafer W with respect to these unit blocks E1 to E6 are denoted by TRS31 to TRS36. Also, in addition to TRS33 and TRS34, some delivery modules located corresponding in height to the unit blocks E3 and E4 and used to deliver the wafer W with respect to these unit blocks E3 and E4 are denoted by TRS43 and TRS44. Besides, a transfer module TRS37 is provided at the lower portion of the tower T2 to deliver the wafer W between the transfer mechanism 87 and the transfer mechanism 89, and a transfer module TRS38 is provided at the upper portion of the tower T2 to deliver the wafer W between the transfer mechanism 87 and the transfer mechanism 88. The temperature control modules SCPL of the tower T2 are provided at positions corresponding in height to the unit blocks E3 to E6 and denoted by SCPL33 to SCPL36.

An FFU 86 provided at the upper portion of the interface block D4 supplies air to a filter 85 (see FIG. 3) provided above the cup 43 of the post-exposure cleaning module 80 to form a down flow. In addition to the filter 58, the interface block D4 is also equipped with a filter that forms a down flow in the wafer transfer region inside the housing 81 with the air supplied from the FFU 86, but the illustration of this filter is omitted in the drawing.

Further, the coating and developing apparatus 1 includes a controller 10 (see FIG. 1). The controller 10 is implemented by a computer and includes a program, a memory and a CPU. The program includes step groups which are combined so as to perform a series of operations in the coating and developing apparatus 1. Further, the controller 10 outputs, based on the program, control signals to the respective components of the coating and developing apparatus 1 to control operations of the respective components, and, thus, the wafer W is transferred and processed as will be described later. The program is stored in a storage medium such as a compact disk, a hard disk, a DVD or the like and installed into the controller 10.

Figure 12:
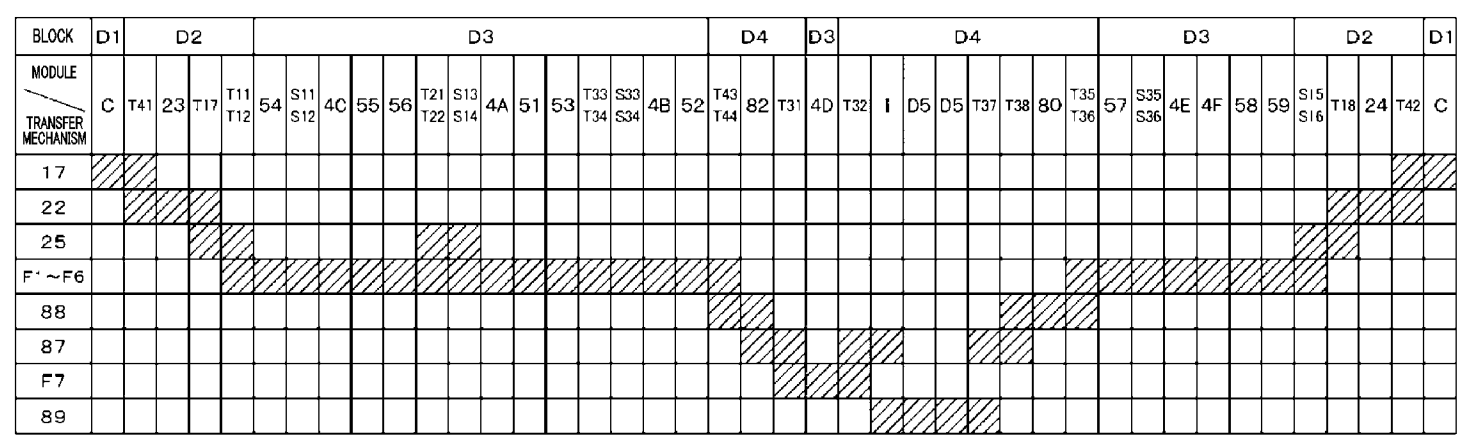
Figure 13:
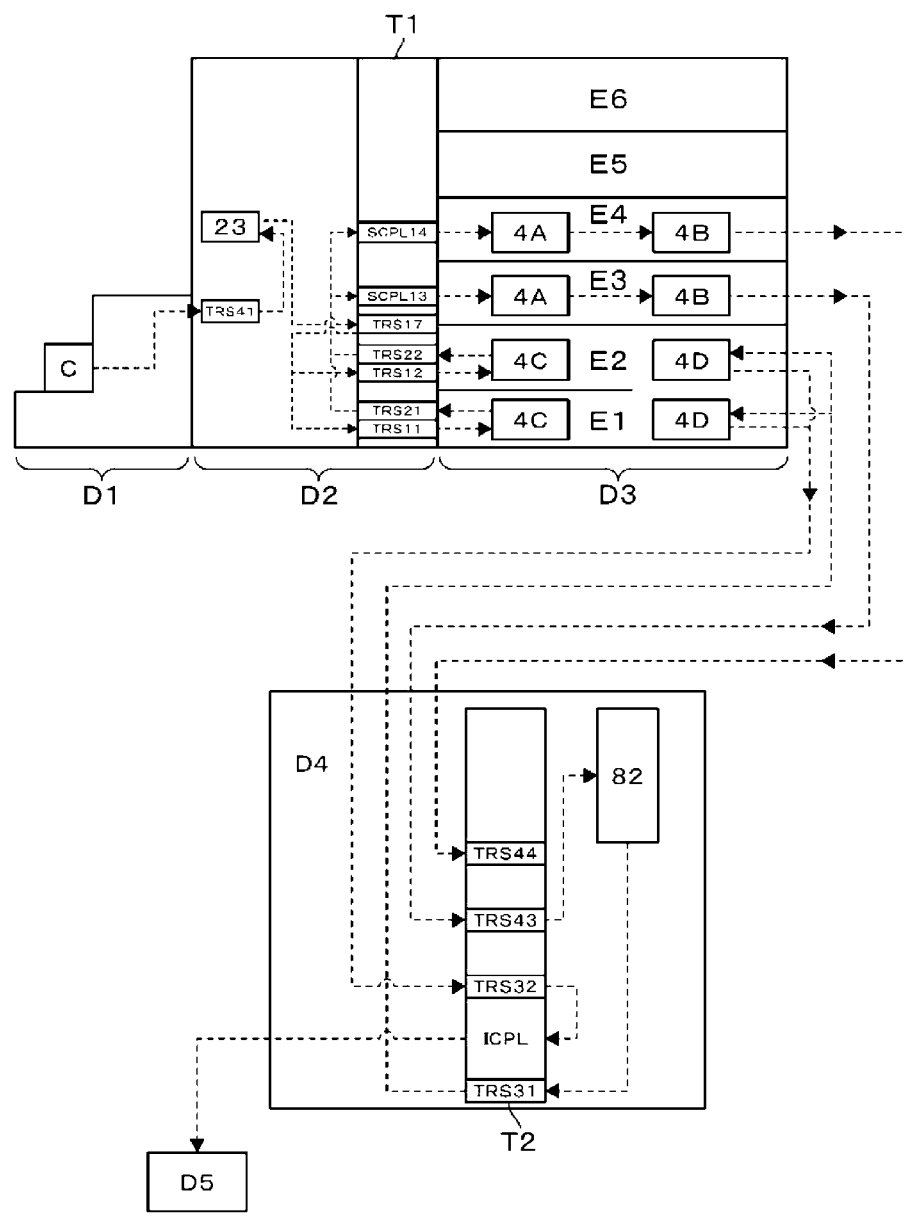
FIG. 13 is a schematic diagram illustrating the wafer transfer route in the coating and developing apparatus.
Figure 14:
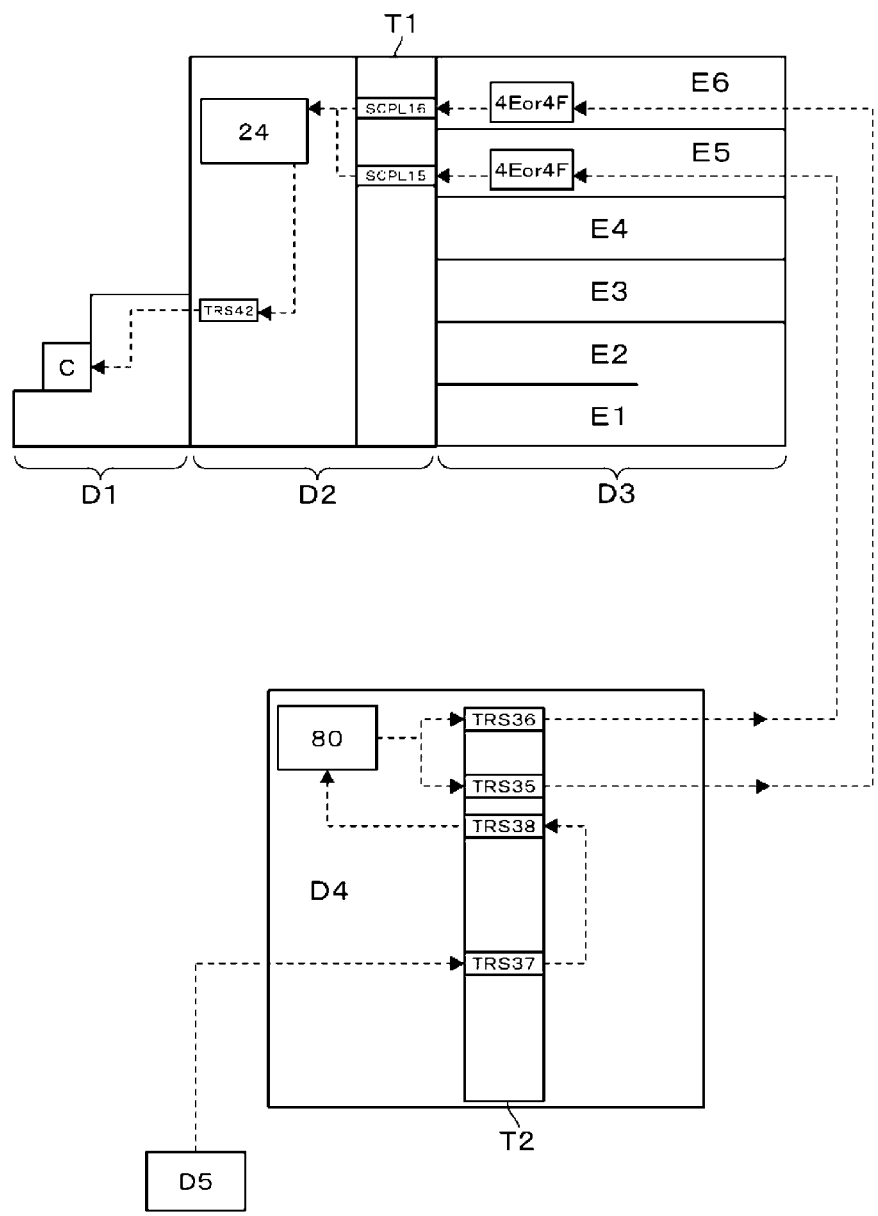
FIG. 14 is a schematic diagram illustrating the wafer transfer route in the coating and developing apparatus.

Hereinafter, a wafer transfer route in the coating and developing apparatus 1 will be described with reference to FIG. 12 to FIG. 14. A table in FIG. 12 shows the correspondence between the modules and the transfer mechanisms used to carry the wafer W into and out of the corresponding modules. More specifically, the modules are described in a row of the table according to a transfer order of the wafer W and the transfer mechanisms are described in a column of the table, and the correspondence between the module and the transfer mechanism used to carry the wafer W into and out of the corresponding module is indicated by a hatched square in the table. Further, in the table, TRS is abbreviated to T, SCPL to S and ICPL to I. The carrier C is also described as the module. Furthermore, the table shows that which of the blocks D1 to D5 each module belongs to. For convenience of illustration, some of the temperature control modules SCPL and the delivery modules TRS of the inspection block D2 and the interface block D4 are illustrated as provided in the processing block D3. Also, in FIG. 13 and FIG. 14, a transfer route is schematically indicated by arrows, and the illustration of some of the modules through which the wafer W passes is omitted. FIG. 13 illustrates a route for the wafer W from the carrier C to the exposure apparatus D5, and FIG. 14 illustrates a route for the wafer W from the exposure apparatus D5 to the carrier C.

The wafer W from the carrier C is transferred by the transfer mechanism 17 of the carrier block D1 to the delivery module TRS41 of the inspection block D2 and transferred by the transfer mechanism 22 to the pre-processing inspection module 23 to be inspected therein, and then, transferred by the transfer mechanism 22 to the delivery module TRS17 of the tower T1. The wafer W transferred to the delivery module TRS17 is distributed by the transfer mechanism 25 to the delivery module TRS11 or TRS12 of the tower T1.

The wafer W transferred to the delivery module TRS11 is carried into the unit block E1 by the transfer mechanism F1. Then, the wafer W is transferred in sequence to the hydrophobic processing modules 54, the temperature control module SCPL11 of the tower T1, the chemical liquid coating module 4C, the heating module 55 and the inspection module 56 to be sequentially subjected to the hydrophobic processing, the temperature control processing, the antireflection film formation processing, the heating processing and the inspection. Then, the wafer W is transferred by the transfer mechanism F1 to the delivery module TRS21 of the tower T1 and carried out of the unit block E1. Meanwhile, the wafer W transferred to the delivery module TRS12 is carried into the unit block E2 by the transfer mechanism F2. Then, the wafer W is processed in the same manner as the wafer W carried into the unit block E1, and then, transferred to the delivery module TRS22 of the tower T1, so that the wafer W is carried out of the unit block E2.

The wafer W transferred to the transfer module TRS12 or TRS22 as described above is distributed by the transfer mechanism 25 to the temperature control module SCPL13 or SCPL14 of the tower T1. The wafer W transferred to the temperature control module SCPL13 is carried into the unit block E3 by the transfer mechanism F3. Then, the wafer W is transferred in sequence to the resist coating module 4A, the heating module 51, the inspection module 53, the delivery module TRS33 of the tower T2, the temperature control module SCPL33, the chemical liquid coating module 4B for protective film formation and the heating module 52. Thus, the wafer W is sequentially subjected to the temperature control processing, the resist film formation processing, the heating processing, the inspection, the temperature control processing and the heating processing. Then, the wafer W is transferred by the transfer mechanism F3 to the delivery module TRS43 of the tower T2, so that the wafer W is carried into the interface block D4 from the unit block E3.

The wafer W transferred to the temperature control module SCPL14 is carried into the unit block E4 by the transfer mechanism F4 and processed in the same manner as the wafer W carried into the unit block E3, and then, transferred to the delivery module TRS44 of the tower T2. That is, the wafer W is transferred from the unit block E4 to the interface block D4.

The wafer W in the delivery module TRS43 or TRS44 is transferred to the buffer module 82 by the transfer mechanism 88 at the central portion in the forward-backward direction inside the interface block D4 and transferred to the delivery module TRS31 of the tower T2 by the transfer mechanism 87 on the back side of the interface block D4. Then, the wafer W in the delivery module TRS31 is carried into the unit block E1 or E2 again by the transfer mechanism F7 to be transferred to the rear surface cleaning module 4D. After the rear surface of the wafer W is cleaned in the rear surface cleaning module 4D, the wafer W is transferred by the transfer mechanism F7 to the delivery module TRS32 of the tower T2 and thus returned to the interface block D4. This wafer W is transferred by the transfer mechanism 87 to the temperature control module ICPL and subjected to the temperature control. Then, the wafer W is transferred by the transfer mechanism 89 to the exposure apparatus D5, and, thus, the resist film on the surface of the wafer W is exposed.

The exposed wafer W is transferred by the transfer mechanism 89 to the delivery module TRS37 of the tower T2, transferred by the transfer mechanism 87 to the delivery module TRS38 of the tower T2 and transferred by the transfer mechanism 88 to the post-exposure cleaning module 80 and then cleaned therein. Thereafter, the wafer W is distributed by the transfer mechanism 88 to the delivery module TRS35 or TRS36.

The wafer W transferred to the delivery module TRS35 is carried into the unit block E5 by the transfer mechanism F5. Then, the wafer W is transferred in sequence to the heating module 57, the temperature control module SCPL35 of the tower T2, the first developing module 4E or the second developing module 4F, the heating module 58 and the inspection module. Thus, the wafer W is sequentially subjected to the heating processing, the temperature control processing, the developing processing, the heating processing and the inspection. Then, the wafer W is transferred by the transfer mechanism F5 to the temperature control module SCPL15 of the tower T1, so that the wafer W is carried out of the unit block E5 to the inspection block D2.

The wafer W transferred to the delivery module TRS36 is carried into the unit block E6 by the transfer mechanism F6. Then, the wafer W is processed in the same manner as the wafer W carried into the unit block E5, and then, transferred to the temperature control module SCPL16 of the tower T1. That is, the wafer W is carried out of the unit block E6 to the inspection block D2. As such, the wafer W transferred to the temperature control module SCPL15 or SCPL16 is transferred by the transfer mechanism 25 to the delivery module TRS18 of the tower T1 and transferred by the transfer mechanism 22 to the post-processing inspection module 24 and then inspected therein. After the inspection, the wafer W is transferred by the transfer mechanism 22 to the delivery module TRS42 and returned by the transfer mechanism 17 to the carrier C. Although the transfer route for the wafer W in the unit blocks E2, E4 and E6 has been described briefly, the wafer W is transferred to pass through the same modules as in the unit modules E1, E3 and E5. However, as the delivery module TRS and the temperature control module SCPL, the modules arranged respectively corresponding in height to the unit blocks are used.

As described above, in the coating and developing apparatus 1, the chemical liquid coating module 4C and the transfer mechanisms F1 and F2 configured to deliver the wafer W between the chemical liquid coating module 4C and the inspection block D2 capable of vertically transferring the wafer W are provided on the left side of the unit blocks E1 and E2. Meanwhile, the rear surface cleaning module 4D and the transfer mechanism F7 configured to deliver the wafer W between the rear surface cleaning module 4D and the interface block D4 capable of vertically transferring the wafer W are provided on the right side of the unit blocks E1 and E2. On the unit blocks E1 and E2, the unit blocks E3 and E4 respectively equipped with the transfer mechanisms F3 and F4 are stacked. Further, when the wafer W is sequentially processed by the chemical liquid coating module 4C and the rear surface cleaning module 4D and then transferred to the exposure apparatus D5, the wafer W processed by the chemical liquid coating module 4C is first carried out of the unit block E1 or E2 to the inspection block D2. Then, the wafer W is transferred to the rear surface cleaning module 4D via the unit blocks E3 or E4 and the interface block D4 in sequence. After the rear surface cleaning, the wafer W is returned to the interface block D4. With this configuration, one of the delivery of the wafer W between the chemical liquid coating module 4C and the inspection block D2 and the delivery of the wafer W between the rear surface cleaning module 4D and the interface block D4 can be performed without being affected by the other. That is, the carry-in/out of the wafer W with respect to the chemical liquid coating module 4C and the carry-in/out of the wafer W with respect to the rear surface cleaning module 4D can be rapidly performed, respectively. Also, there is no need to provide a module for delivering the wafer W with respect to the transfer mechanism such as the delivery module TRS between the wafer transfer region of the transfer mechanisms F1 and F2 and the wafer transfer region of the transfer mechanism F7. Therefore, it is possible to reduce the width of the coating and developing apparatus 1. For this reason, the coating and developing apparatus 1 can achieve the high throughput with the small foot print. Also, according to the above-described Patent Document 1, when the wafer W is delivered between the transfer mechanisms placed on the left and right sides of layers (unit blocks) of the same height, the wafer placing unit provided between the transfer mechanisms is used. The placing unit causes the increase in the length of the layers, which makes it difficult to reduce the foot print of the apparatus.

An advantage of the small length of the coating and developing apparatus 1 in the left-right direction will be described in more detail. In general, when a coating and developing apparatus is provided in a clean room, the width of the coating and developing apparatus is limited. More specifically, a movable range of an external transfer mechanism that transfers a carrier C with respect to the coating and developing apparatus is limited inside the clean room. Therefore, a position where a block for carry-in/out of the carrier C constituting the coating and developing apparatus can be installed is limited. Meanwhile, in some cases, the arrangement of the exposure apparatus D5 inside the clean room may be determined in advance. Under such circumstances, a coating and developing apparatus having a large length in the left-right direction cannot be installed inside the clean room. However, the coating and developing apparatus 1 has a relatively small length in the left-right direction due to the above-described configuration and thus can overcome this problem. Also, in the coating and developing apparatus 1, the rear surface cleaning module 4D is placed in the unit blocks E1 and E2 as described above and the wafer W is transferred along the above-described route. Therefore, there is no need to place the rear surface cleaning module 4D in the interface block D4. Accordingly, suppressing an increase in the size of the interface block D4 also contributes to the reduction in the length of the coating and developing apparatus 1 in the left-right direction.

Further, the unit blocks E3 and E4 of the coating and developing apparatus 1 are equipped with the resist coating module 4A and the chemical liquid coating module 4B for protective film formation. That is, the unit blocks E3 and E4 through which the wafer W passes to be transferred from the left side to the right side of the unit blocks E1 and E2 are equipped with the resist coating module 4A and the chemical liquid coating module 4B for protective film formation. Therefore, there is no need to transfer the wafer W to any unit block E other than E1 to E4 until the rear surface of the wafer W is cleaned. Accordingly, it is possible to suppress the increase in the length of the wafer transfer route and thus possible to more reliably suppress the decrease in the throughput. Also, it is possible to suppress the increase in the number of unit blocks E and thus possible to suppress the increase in the size of the apparatus.

Further, the rear surface cleaning module 4D is provided in each of the unit blocks E1 and E2 and thus arranged in two stages. Since the rear surface cleaning module 4D is arranged in the multiple stages, the delivery module TRS (denoted by TRS31 and TRS32 as described above) for the delivery with respect to the rear surface cleaning module 4D can also be provided in a large height range in the tower T2 of the interface block D4, which means that the delivery module TRS can be configured such that more wafers W can be placed. Since more wafers W can be placed, even if a processing is temporarily stopped in a processing module on a downstream side of the delivery module TRS, each processing module on an upstream side of the delivery module TRS can continue to process the wafer W. That is, it is possible to suppress the stoppage of processing the wafer W in the entire apparatus and thus possible to suppress the decrease in the throughput. Also, the transfer mechanism F7 vertically moves along the common transfer path 66 of the unit blocks E1 and E2 and thus can access the large height range of the tower T2. For this reason, the delivery modules TRS31 and TRS32 can be configured such that more wafers W can be placed. Further, the transfer mechanism F7 performs the receiving of the wafer W from the interface block D4 and carry-out of the wafer W to the interface block D4 by using TRS31 and TRS32, respectively, of the tower T2. That is, the transfer mechanism F7 delivers the wafer W between the transfer mechanism of the interface block D4 and the transfer mechanisms of the unit blocks E1 and E2 by using the modules at different stages (heights). With this configuration, a sufficient space can be secured for the delivery modules TRS31 and TRS32, which contributes to an efficient transfer between the interface block D4 and the transfer mechanism F7.

Since the rear surface cleaning module 4D is provided in two stages and the distance between the cups 43 of the rear surface cleaning module 4D is narrowed due to the absence of the nozzle 45, the installation unit 39 of the processing liquid supply device including the pump is provided between the chemical liquid coating module 4C and the rear surface cleaning module 4D. That is, the processing liquid supply device is provided between the cups 43 constituting the liquid processing modules in the unit block E. Since the processing liquid supply device is provided as such, it is possible to suppress the increase in the length of the processing liquid supply line from the pump to the nozzle of each liquid processing module. If the filter is provided on the upstream side of the pump in the processing liquid supply line to suppress the pressure loss of the processing liquid, the distance between the filter and the nozzle is narrowed, and, thus, the efficiency of collecting the foreign substances in the processing liquid can be improved. That is, the arrangement of the processing liquid supply device contributes to suppressing the decrease in the yield of semiconductor products manufactured from the wafer W. Further, since the processing liquid supply device is provided in the lower unit blocks E1 and E2 among the unit blocks E, it is easy for the operator to carry out the maintenance.

The transfer mechanism F7 accesses fewer types of the modules than the transfer mechanisms F1 and F2. That is, the transfer mechanism F7 performs a smaller number of transfer processes than the transfer mechanisms F1 and F2. Since the transfer mechanism F7 that performs the small number of transfer processes is a component shared by the unit blocks E1 and E2, it is possible to achieve the sufficient throughput and reduce the manufacturing cost of the apparatus.

Further, in the coating and developing apparatus 1, the height of the carrier block D1 is smaller than the height of the inspection block D2 adjacent to the carrier block D1 as described above, and the carrier C stands by above the carrier block D1. With this configuration, there is no need to provide the carrier standby unit 20 and the carrier carry-in/out unit 19 on the left side of the carrier block D1. Therefore, it is possible to more reliably suppress the increase in the length of the coating and developing apparatus 1 in the left-right direction. When the carrier standby unit 20 and the carrier carry-in/out portion 19 are arranged above the carrier block D1, the FFU 31 for forming the down flow in the carrier block D1 is located on the inspection block D2 so as not to overlap the filter 18 when viewed from the top. That is, with this arrangement of the FFU 31, the increase in the length of the coating and developing apparatus 1 in the left-right direction can be suppressed. Also, the FFU 31 is not limited to being provided on the inspection block D2, but may be provided, for example, in front of or behind the coating and developing apparatus 1.

Further, in the coating and developing apparatus 1, the transfer mechanism 87 that accesses the tower T2 is provided behind the tower T2 configured to deliver the wafer W between the interface block D4 and the processing block D3. Meanwhile, the auxiliary equipment installation unit 36 that protrudes from the unit block E of the processing block D3 is provided in front of the tower T2, so that the tower T2 is interposed between the auxiliary equipment installation unit 36 and the transfer mechanism 87 in the forward-backward direction. With this arrangement of the components, the auxiliary equipment installation unit 36 can suppress the increase in the length of the coating and developing apparatus 1 in the left-right direction, and, thus, it is possible to more reliably suppress the increase in the foot print of the coating and developing apparatus 1. Furthermore, the auxiliary equipment installation unit 35 and the transfer mechanism 25 are provided in the inspection block D2, so that the tower T1 is interposed therebetween in the forward-backward direction. This arrangement of the components can also suppress the increase in the length of the coating and developing apparatus 1 in the left-right direction.

Further, the wafer W whose rear surface has not yet been cleaned stands by in the buffer module 82 of the interface block D4. Therefore, until the wafer W is carried into the exposure apparatus D5 after the rear surface cleaning, the number of modules the wafer W passes through is small, and, thus, it is possible to more reliably suppress the wafer W with the foreign substances adhering to the rear surface from being carried into the exposure apparatus D5. Accordingly, it is possible to more reliably suppress the defocus during the exposure.

Further, in the interface block D4, the transfer mechanism 87 that accesses each of the post-exposure cleaning module 80, the modules of the tower T2 and the buffer module 82 is provided at the central portion in the forward-backward direction and the transfer mechanism 88 that accesses the modules of the tower T2 and the buffer module 82 is provided on the back side. Furthermore, the transfer mechanism 88 that does not access the post-exposure cleaning module 80 has a greater vertically movable range than the transfer mechanism 87, and the holding body 61 accesses the module placed at the lower position in the tower T2. With this configuration, the deviation of the load between the transfer mechanisms 87 and 88 can be suppressed, and, thus, it is possible to more reliably increase the throughput.

Further, in the unit blocks E1 to E4, the auxiliary equipment is divided into two parts for the cups 43 on the left side and for the cups 43 on the right side. The auxiliary equipment of the unit blocks E1 to E4 may also be divided into three parts as in the unit blocks E5 and E6. However, desirably, only the auxiliary equipment of the unit blocks E5 and E6 each having more cups than the unit blocks E1 to E4 is divided into three parts to simplify the structure of the auxiliary equipment.

In the coating and developing apparatus 1, two same unit blocks E are provided, but the present disclosure is not limited thereto. For example, only one unit block E or three or more same unit blocks E may be provided. Also, the arrangement order of the unit blocks E is not limited to the above-described example. For example, the unit blocks E1 and E2 may be located on the unit blocks E3 and E4.

Further, the arrangement of the modules in the coating and developing apparatus 1 is not limited to the above-described example. For example, the rear surface cleaning modules 4D may not be provided on the right side of the unit blocks E1 and E2, but instead, the chemical liquid coating module 4B for protective film formation and the heating module 52 for heating the wafer W on which the protective film has been formed may be provided. Furthermore, as the liquid processing modules in the unit blocks E3 and E4, only the resist coating modules 4A may be provided, but the chemical liquid coating modules 4B may not be provided. The wafer W may pass through each unit block E along the above-described transfer rout and may be subjected to the same processings as described above except that the wafer W undergoes the protective film formation and the subsequent heating processing in the unit blocks E1 and E2 without the rear surface cleaning. Therefore, the modules provided on the right side of the unit blocks E1 and E2 are not limited to the cleaning modules.

As another arrangement example of the modules in the coating and developing apparatus 1, the resist coating modules 4A may be provided on the left side of the unit blocks E1 and E2 and the rear surface cleaning modules 4D may be provided on the right side of the unit blocks E1 and E2, and the chemical liquid coating modules 4B for protective film formation may be provided in the unit blocks E3 and E4. That is, the modules are arranged not to form the antireflection film and the wafer W may pass through each unit block along the above-described route and may be carried into the exposure apparatus D5. Also, if the exposure apparatus D5 does not perform the liquid immersion exposure, the coating and developing apparatus 1 may be configured not to perform the protective film formation. In the unit blocks E3 and E4, only the resist coating modules 4A may be provided as the liquid processing modules, and as described above, the wafer W may be transferred between the blocks to be subjected to the processing.

Figure 15:
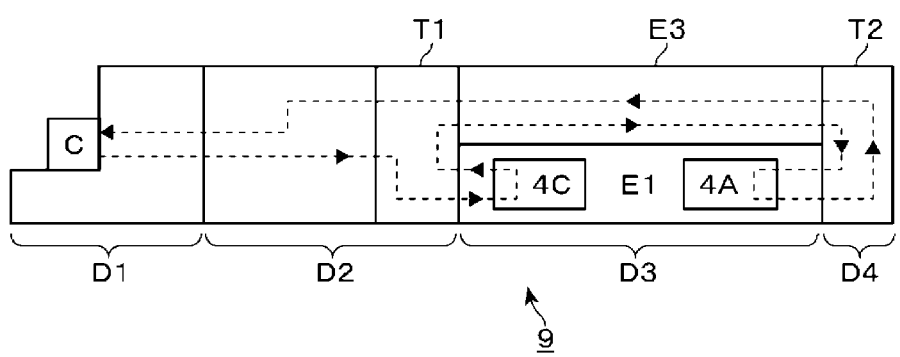
FIG. 15 is a schematic side view of a coating apparatus.

The application of the present disclosure is not limited to the coating and developing apparatus. FIG. 15 illustrates a coating apparatus 9. The coating apparatus 9 is different from the coating and developing apparatus 1 in that the coating apparatus 9 is not connected to the exposure apparatus D5. Also, as the unit blocks E, only two unit blocks E1 and E3 are provided. Therefore, the unit block E1 does not include the common transfer path 66 that communicates with the unit block E2 and each of the transfer mechanisms F1 and F7 on the left side and the right side, respectively, of the transfer path 30 transfers the wafer W. As the liquid processing modules in the unit block E1, the chemical liquid coating module 4C for antireflection film formation is provided on the left side and the resist coating module 4A is provided on the right side. The unit block E3 is not equipped with the processing module.

In FIG. 15, arrows indicate the wafer transfer route. The wafer W is processed by the chemical liquid coating module 4B and then returned to the inspection block D2 and transferred to the interface block D4 via the unit block E3. Then, the wafer W is transferred to the resist coating module 4A to be processed therein. Thereafter, the wafer W is transferred to the interface block D4 and then returned to the carrier C through the unit block E3 and the inspection block D2 in sequence. Also, in the towers T1 and T2, the delivery modules TRS are located at positions suitable for transferring the wafer W. This coating apparatus 9 has the same effect as the coating and developing apparatus 1. The unit block E that transfers the wafer W from the inspection block D2 to the interface block D4 and the unit block E that transfers the wafer W from the interface block D4 to the inspection block D2 may be identical as in the coating apparatus 9 or may be different from each other as in the coating and developing apparatus 1.

The liquid processings performed in the apparatus are not limited to the above-described examples and may further include formation of an insulating film by coating a chemical liquid or a processing for coating an adhesive for bonding a wafer W. Also, the exemplary embodiments disclosed herein are illustrative in all aspects and do not limit the present disclosure. Further, the above-described exemplary embodiments may be omitted, substituted, or changed in various forms without departing from the scope and spirit of the appended claims.

According to the present disclosure, the substrate processing apparatus can achieve the high throughput with the small foot print.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A substrate processing apparatus, comprising:
   a first unit block including a first substrate transfer region extended in a left-right direction; a first processing module and a second processing module provided to respectively face a first side and a second side of the first substrate transfer region in the left-right direction; and a first transfer mechanism and a second transfer mechanism respectively provided at the first side and the second side of the first substrate transfer region in the left-right direction and configured to deliver a substrate to the first processing module and the second processing module, respectively, wherein the first substrate transfer region has a first transfer path and a second transfer path that do not overlap each other when viewed from above, the first transfer mechanism transfers the substrate by moving only the first transfer path among the first and second transfer paths, and the second transfer mechanism transfers the substrate by moving only the second transfer path among the first and second transfer paths such that the first transfer mechanism and the second transfer mechanism have movement areas that do not overlap with each other within the first unit block;

a second unit block including a second substrate transfer region extended in the left-right direction; and a third transfer mechanism configured to transfer the substrate along the left-right direction in the second substrate transfer region, the second unit block being stacked on the first unit block;

a substrate carry-in/out block including first side placing units provided at a first side in the left-right direction of a stack of the unit blocks composed of the first unit block and the second unit block and configured to place therein the substrate to deliver the substrate to each of the first transfer mechanism and the third transfer mechanism, the first side placing units being provided to correspond to heights of the first unit block and the second unit block; and a carrier stage on which a carrier accommodating therein the substrate is placed;

a relay block including second side placing units provided at a second side in the left-right direction of the stack of the unit blocks and configured to place therein the substrate to deliver the substrate to each of the second transfer mechanism and the third transfer mechanism, the second side placing units being provided to correspond to the heights of the first unit block and the second unit block;

a second side transfer mechanism provided in the relay block to transfer the substrate between the second side placing units; and a first side transfer mechanism provided in the substrate carry-in/out block to transfer the substrate between the carrier and each of the first side placing units, the first side transfer mechanism being configured to transfer the substrate, which is processed by the first processing module and is not processed by the second processing module, from one of the first side placing units corresponding to the height of the first unit block to one of the first side placing units corresponding to the height of the second unit block in order to transfer the substrate from a second side of the first unit block into the second processing module through the second unit block and the relay block in sequence.

2. The substrate processing apparatus of claim 1,
wherein in the second unit block, a third processing module to which the substrate is delivered by the third transfer mechanism is provided to face the second substrate transfer region, and
the third processing module is configured to process the substrate, which is processed by the first processing module and is not processed by the second processing module.

3. The substrate processing apparatus of claim 2,
wherein the first processing module and the third processing module include a coating module configured to form a coating film by supplying a coating solution onto the substrate.

4. The substrate processing apparatus of claim 2,
wherein the second unit block includes a unit block for outgoing path configured to transfer the substrate from the substrate carry-in/out block to the relay block and a unit block for incoming path configured to transfer the substrate from the relay block to the substrate carry-in/out block,
each of the unit block for outgoing path and the unit block for incoming path includes the second substrate transfer region and the third transfer mechanism,
the unit block for outgoing path includes the third processing module,
the unit block for incoming path includes a fourth processing module configured to process the substrate which is processed by the first, second and third processing modules, and
the first side placing units and the second side placing units are provided at respective positions corresponding to the heights of the unit block for outgoing path and the unit block for incoming path.

5. The substrate processing apparatus of claim 4,
wherein any one of the first processing module, the second processing module and the third processing module in the unit block for outgoing path includes a resist coating module configured to form a resist film by supplying a resist onto the substrate, and
the fourth processing module is a developing module provided facing the second substrate transfer region to develop the resist film which is exposed by an exposure apparatus connected to the relay block and configured to expose the resist film.

6. The substrate processing apparatus of claim 5,
wherein the first processing module and the second processing module are arranged in the left-right direction,
the first processing module, the second processing module and the third processing module are liquid processing modules configured to process the substrate by supplying a processing liquid, and
a supply device configured to supply the processing liquid to each of the first processing module, the second processing module and the third processing module is provided between the first processing module and the second processing module.

7. The substrate processing apparatus of claim 6,
wherein the first processing module is a coating module configured to form a coating film by supplying a coating solution onto the substrate, and
the second processing module is a cleaning module configured to clean the substrate after the resist film is formed and before the resist film is exposed by the exposure apparatus.

8. The substrate processing apparatus of claim 5,
wherein the second side placing units are arranged in a row in a longitudinal direction,
in the relay block, a post-exposure processing module configured to process the substrate which is exposed by the exposure apparatus and is not developed; and a staying module located deviating from the row of the second side placing units and configured to place and hold the substrate which is not processed by the second processing module are provided, wherein the second side transfer mechanism includes:
a first second-side transfer mechanism configured to transfer the substrate among the post-exposure processing module, the staying module and the second side placing units; and
a second second-side transfer mechanism configured to transfer the substrate between the post-exposure processing module and the second side placing units, and
wherein a substrate transfer region of the second second-side transfer mechanism is longer in the longitudinal direction than a substrate transfer region of the first second-side transfer mechanism.

9. The substrate processing apparatus of claim 1,
wherein as the processing modules in a first one of the unit blocks constituting the stack of the unit blocks, liquid processing modules are arranged in the left-right direction and configured to process the substrate by supplying a processing liquid, and
in a row of the liquid processing modules, an auxiliary equipment of processing modules on a left side, an auxiliary equipment of processing modules on a central side and an auxiliary equipment of processing modules on a right side are divided from each other.

10. The substrate processing apparatus of claim 9,
wherein each of the liquid processing modules includes a cup configured to accommodate therein the substrate and supply the processing liquid onto the substrate, and
the auxiliary equipment includes an exhaust path forming member connected to the cup and configured to form an exhaust path for exhausting an inside of the cup.

11. The substrate processing apparatus of claim 9,
wherein each of the liquid processing modules includes a cup configured to accommodate therein the substrate and supply the processing liquid onto the substrate, and
a number of the cup in the first one of the unit blocks is larger than that in a second one of the unit blocks constituting the stack of the unit blocks.

12. The substrate processing apparatus of claim 1,
wherein in the relay block, the second side placing units are arranged in a row in a longitudinal direction,
the second side transfer mechanism is composed of multiple transfer mechanisms, and
one of the multiple transfer mechanisms and an auxiliary equipment installation unit including an auxiliary equipment of the second processing module are provided with the row of the second side placing units in a forward-backward direction therebetween.

13. The substrate processing apparatus of claim 1,
wherein the first unit block includes multiple first unit blocks, and the multiple first unit blocks are continuously provided in multiple stages in a longitudinal direction, and the second processing module is provided in the first unit block in each of the multiple stages.

14. The substrate processing apparatus of claim 1,
wherein the first side of the first substrate transfer region in the left-right direction is partitioned by a ceiling for partitioning each of multiple stages,
the first transfer mechanism includes multiple first transfer mechanisms, and the multiple first transfer mechanisms are provided for each of the multiple stages and transfer the substrate horizontally in the first substrate transfer region,
the second side of the first substrate transfer region in the left-right direction does not have the ceiling, and the second transfer mechanism is configured to vertically move commonly in the multiple stages and transfer the substrate vertically and horizontally in the second substrate transfer region.

15. The substrate processing apparatus of claim 1,
wherein the first side transfer mechanism includes a first first-side transfer mechanism configured to carry in and out the substrate with respect to the carrier and a second first-side transfer mechanism provided on a side with the stack of the unit blocks rather than the first first-side transfer mechanism and configured to vertically move to deliver the substrate between the first transfer mechanism and the third transfer mechanism, and
wherein the substrate processing apparatus includes:
a filter provided on a substrate transfer region of the first first-side transfer mechanism and configured to purify a supplied gas and discharge the purified gas to the transfer region;
a gas supply mechanism provided at a position so as not to overlap the filter when viewed from above and configured to suck a gas and supply the gas to the filter; and
a temporary carrier placing unit where the carrier is to be temporarily placed in the transfer region.

16. The substrate processing apparatus of claim 1, further comprising:
a gas supply/exhaust unit provided to supply and exhaust a gas with respect to the first unit block such that a pressure of the first substrate transfer region is lower than a pressure of the first processing module and higher than a pressure of the second processing module,
wherein the first processing module is a coating module configured to form a coating film by supplying a coating solution onto the substrate and the second processing module is a cleaning module configured to clean the substrate.

17. The substrate processing apparatus of claim 1,
wherein the second processing module includes multiple second processing modules provided in front of and behind the first substrate transfer region, and the multiple second processing modules include cups configured to accommodate therein the substrate and supply a processing liquid onto the substrate, and
a moving mechanism configured to move a holding body, which is provided in the second transfer mechanism and configured to hold the substrate, in the left-right direction is provided in the first substrate transfer region.

18. A substrate processing method, comprising:
delivering a substrate to each of a first processing module and a second processing module by a first transfer mechanism and a second transfer mechanism in a first unit block, the first unit block including a first substrate transfer region extended in a left-right direction; and
the first processing module and the second processing module provided to respectively face a first side and a second side of the first substrate transfer region in the left-right direction, the first transfer mechanism and the second transfer mechanism being respectively provided at the first side and the second side of the first substrate transfer region in the left-right direction, wherein the first substrate transfer region has a first transfer path and a second transfer path that do not overlap each other when viewed from above, the first transfer mechanism transfers the substrate by moving only the first transfer path among the first and second transfer paths, and the second transfer mechanism transfers the substrate by moving only the second transfer path among the first and second transfer paths such that the first transfer mechanism and the second transfer mechanism have movement areas that do not overlap with each other within the first unit block;

transferring the substrate in the left-right direction by a third transfer mechanism in a second substrate transfer region of a second unit block, the second unit block being stacked on the first unit block, the second substrate transfer region being extended in the left-right direction;

placing the substrate on first side placing units, which are provided at respective positions corresponding to heights of the first unit block and the second unit block, in a substrate carry-in/out block, the substrate carry-in/out block being provided on a first side in the left-right direction of a stack of the unit blocks composed of the first unit block and the second unit block; and delivering the substrate among the substrate carry-in/out block, the first transfer mechanism and the third transfer mechanism;

placing a carrier configured to accommodate therein the substrate on a carrier stage provided in the substrate carry-in/out block;

placing the substrate on second side placing units, which are provided at respective positions corresponding to the heights of the first unit block and the second unit block, in a relay block, the relay block being provided on a second side in the left-right direction of the stack of the unit blocks; and delivering the substrate among the relay block, the second transfer mechanism and the third transfer mechanism;

transferring the substrate between the second side placing units by a second side transfer mechanism provided in the relay block;

transferring the substrate between the carrier and each of the first side placing units by a first side transfer mechanism provided in the substrate carry-in/out block; and delivering the substrate, which is processed by the first processing module and is not processed by the second processing module, from one of the first side placing units provided at a position corresponding to the height of the first unit block to one of the first side placing units provided at a position corresponding to the height of the second unit block by the first side transfer mechanism in order to transfer the substrate from a second side of the first unit block to the second processing module through the second unit block and the relay block in sequence.

19. The substrate processing apparatus of claim 1, further comprising:
a controller configured to control, after the substrate is processed by the first processing module:
the first transfer mechanism to provide the substrate to the first side placing units;
the third transfer mechanism to provide the substrate to the second side placing units; and
the second transfer mechanism to transfer the substrate to the second processing module.

20. The substrate processing apparatus of claim 19,
wherein the second processing module is a cleaning module configured to clean the substrate after forming a resist film and before the resist film is exposed by an exposure apparatus, and
the second side transfer mechanism includes a third second-side transfer mechanism configured to transfer the substrate from the second side placing units to the exposure apparatus connected to the relay block,
wherein the controller is further configured to control, after the substrate is processed by the second processing module:
the second transfer mechanism to provide the substrate to the second side placing units;
the third second-side transfer mechanism to transfer the substrate to the exposure apparatus.

* * * * *